US008063660B1

(12) United States Patent
Strader et al.

(10) Patent No.: US 8,063,660 B1
(45) Date of Patent: Nov. 22, 2011

(54) METHOD AND APPARATUS FOR CONFIGURABLE ADDRESS TRANSLATION

(75) Inventors: Thomas H. Strader, San Jose, CA (US); Roger D. Flateau, Jr., Albuquerque, NM (US); Schuyler E. Shimanek, Albuquerque, NM (US); Wayne E. Wennekamp, Rio Rancho, NM (US); Adam Elkins, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/695,341

(22) Filed: Jan. 28, 2010

Related U.S. Application Data

(60) Provisional application No. 61/148,926, filed on Jan. 31, 2009, provisional application No. 61/148,927, filed on Jan. 31, 2009.

(51) Int. Cl.
*H03K 19/177* (2006.01)
(52) U.S. Cl. .............................. 326/40; 326/41; 326/47
(58) Field of Classification Search ............. 326/37–41, 326/47
See application file for complete search history.

(56) References Cited

U.S. PATENT DOCUMENTS

| 5,276,832 | A  | * | 1/1994  | Holman, Jr. ....................... 711/3 |
| 6,181,163 | B1 | * | 1/2001  | Agrawal et al. ................. 326/41 |
| 6,903,574 | B2 | * | 6/2005  | Chen et al. ...................... 326/41 |
| 7,126,372 | B2 | * | 10/2006 | Vadi et al. ....................... 326/38 |
| 2010/0036997 | A1 | * | 2/2010 | Brewer et al. .................... 711/5 |

* cited by examiner

*Primary Examiner* — James H Cho
(74) *Attorney, Agent, or Firm* — Murray Smith; Kevin T. Cuenot; Thomas George

(57) ABSTRACT

A technique is applicable to a device having programmable circuitry that includes a first interface having a plurality of first address terminals, a second interface having a plurality of second address terminals, and a configurable interconnect structure coupled between the first and second interfaces. The technique includes configuring the interconnect structure during field programming to electrically couple each of the address terminals in a first subset of the first address terminals to respective address terminals in a second subset of the second address terminals according to a selected one of a plurality of different mapping functions.

19 Claims, 17 Drawing Sheets

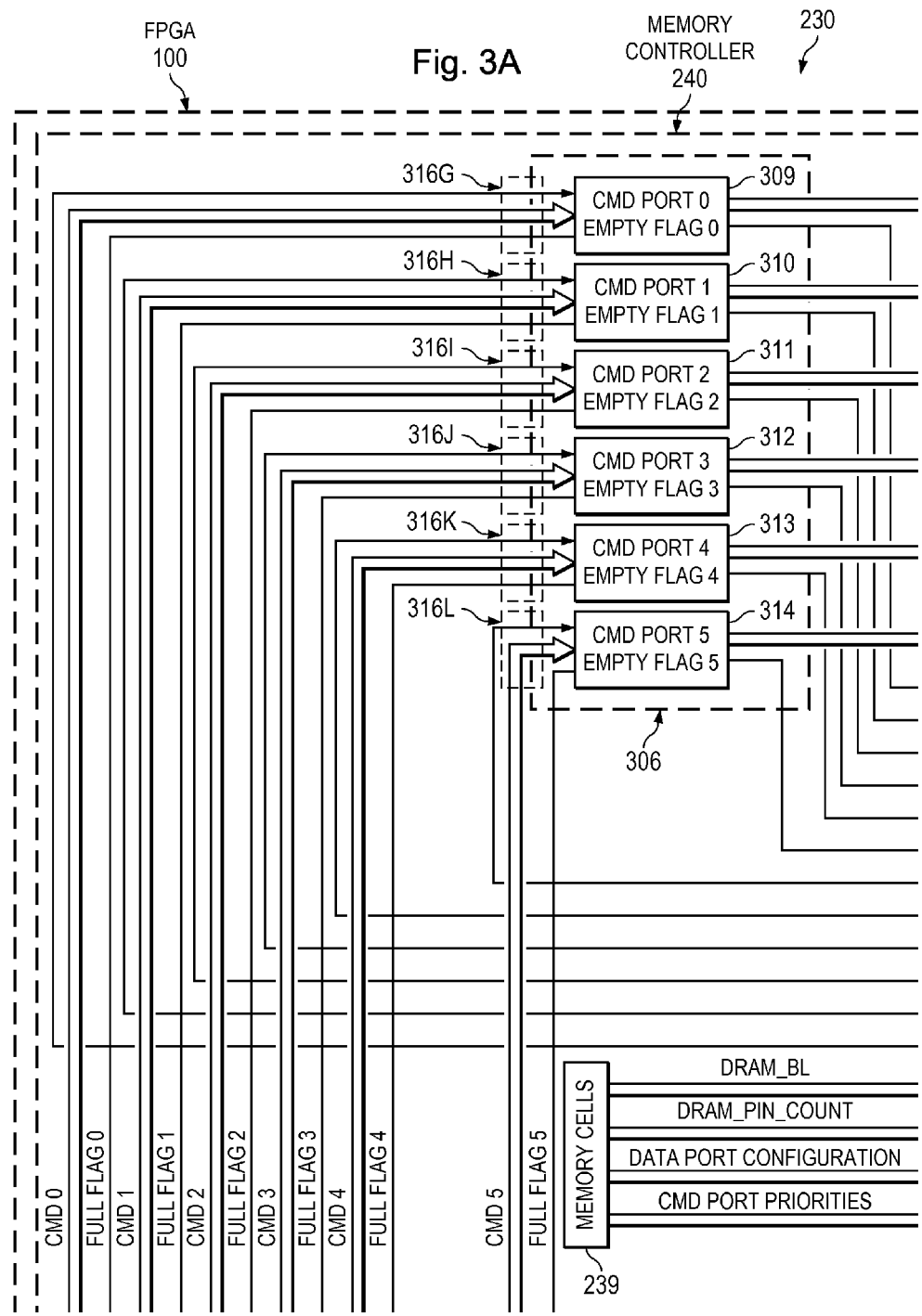

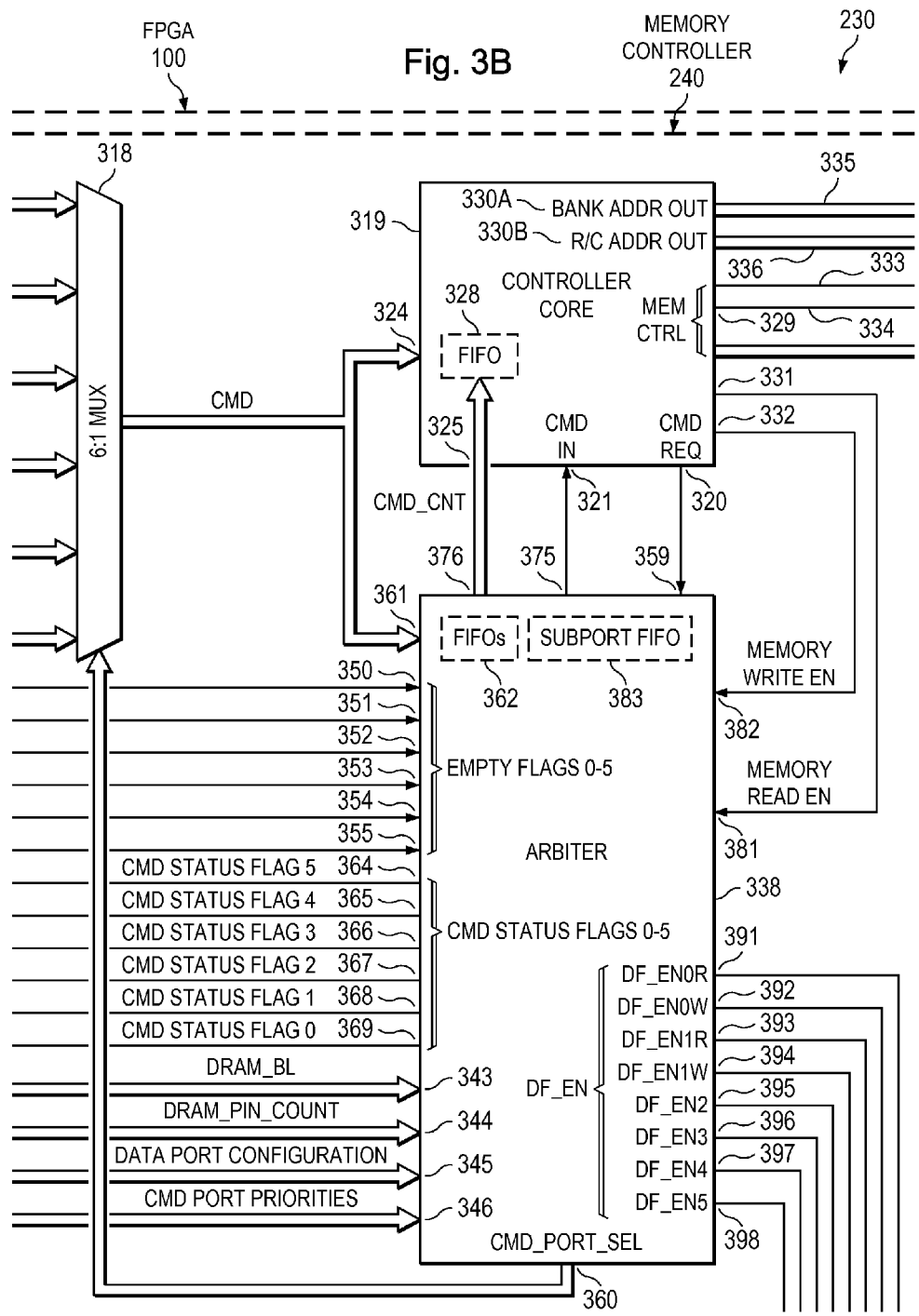

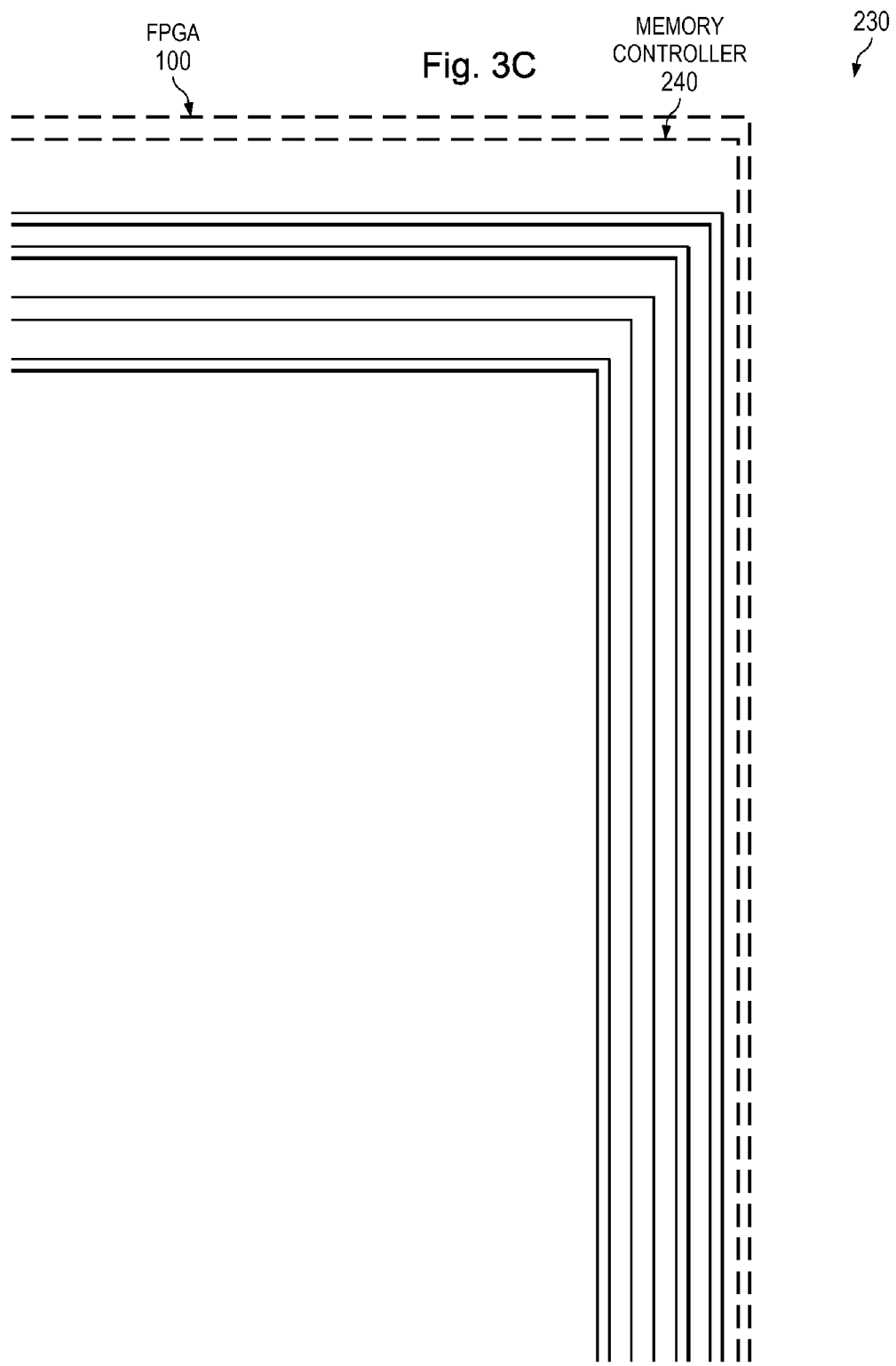

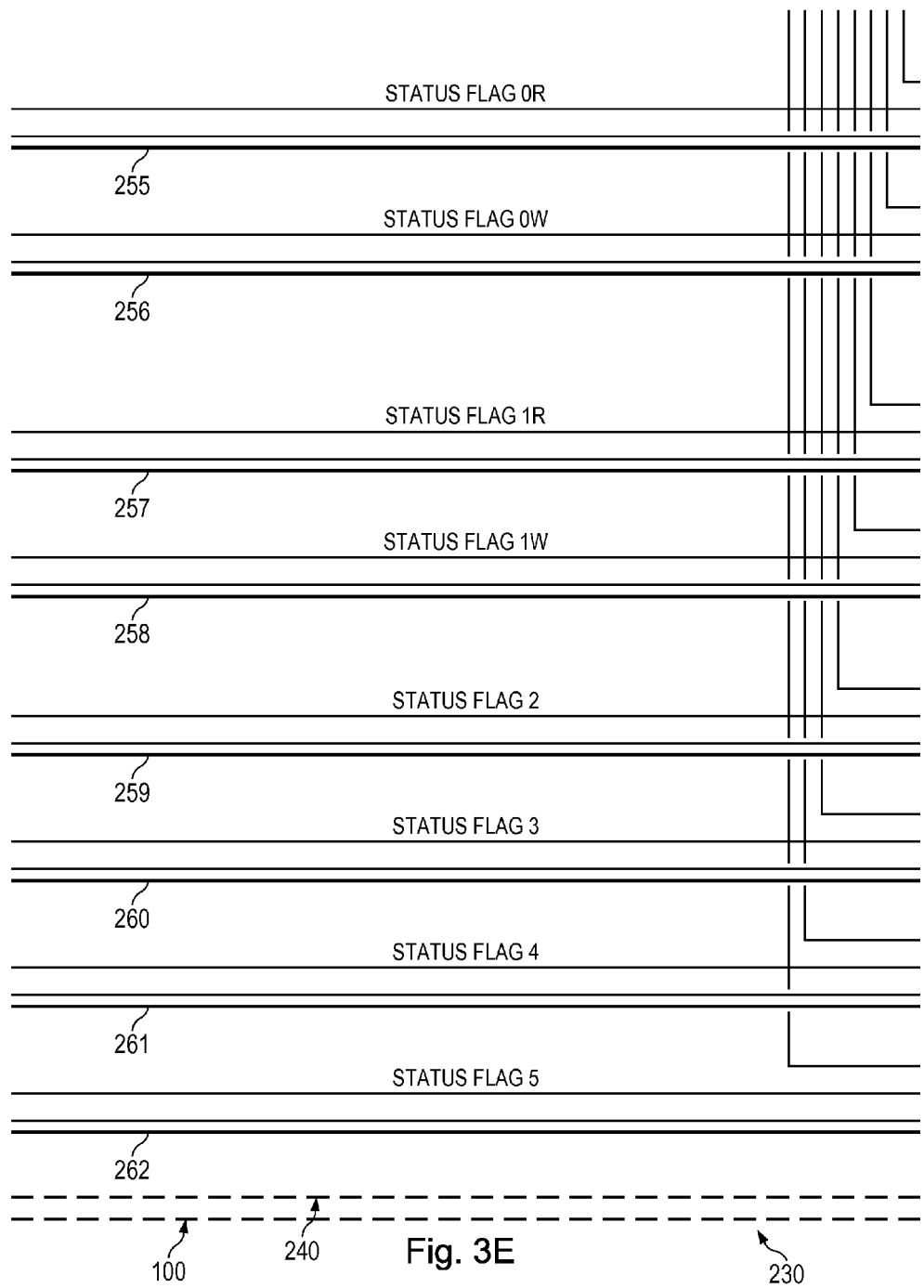

Fig. 8A

| Address Portion | Physical address terminals | DDR x16 128MB | DDR x16 256MB | DDR x16 512MB | DDR x16 1GB | DDR x8 128MB | DDR x8 256MB | DDR x8 512MB | DDR x8 1GB | DDR x4 128MB | DDR x4 256MB | DDR x4 512MB |
|---|---|---|---|---|---|---|---|---|---|---|---|---|
| Bank Address | 779 | (NC) | (NC) | (NC) | (NC) | (NC) | (NC) | (NC) | (NC) | (NC) | (NC) | (NC) |
|  | 778 | (NC) | (NC) | (NC) | 726 | (NC) | (NC) | (NC) | 726 | (NC) | (NC) | 725 |
|  | 777 | 722 | 723 | 724 | 725 | 722 | 723 | 724 | 725 | (NC) | 724 | 724 |
| Row Address | 776 | (NC) | (NC) | (NC) | (NC) | (NC) | (NC) | (NC) | (NC) | (NC) | (NC) | 723 |
|  | 775 | (NC) | (NC) | (NC) | (NC) | (NC) | (NC) | (NC) | (NC) | (NC) | (NC) | (NC) |
|  | 774 | (NC) | (NC) | (NC) | (NC) | (NC) | (NC) | (NC) | (NC) | (NC) | (NC) | (NC) |
|  | 773 | 721 | 722 | 723 | 723 | 721 | 722 | 723 | 723 | 721 | 722 | 723 |
|  | 772 | 720 | 721 | 722 | 722 | 720 | 721 | 722 | 722 | 720 | 721 | 722 |
|  | 771 | 719 | 720 | 721 | 721 | 719 | 720 | 721 | 721 | 719 | 720 | 721 |
|  | 770 | 718 | 719 | 720 | 720 | 718 | 719 | 720 | 720 | 718 | 719 | 720 |
|  | 769 | 717 | 718 | 719 | 719 | 717 | 718 | 719 | 719 | 717 | 718 | 719 |
|  | 768 | 716 | 717 | 718 | 718 | 716 | 717 | 718 | 718 | 716 | 717 | 718 |
|  | 767 | 715 | 716 | 717 | 717 | 715 | 716 | 717 | 717 | 715 | 716 | 717 |
|  | 766 | 714 | 715 | 716 | 716 | 714 | 715 | 716 | 716 | 714 | 715 | 716 |
|  | 765 | 713 | 714 | 715 | 715 | 713 | 714 | 715 | 715 | 713 | 714 | 715 |
|  | 764 | 712 | 713 | 714 | 714 | 712 | 713 | 714 | 714 | 712 | 713 | 714 |
|  | 763 | 711 | 712 | 713 | 713 | 711 | 712 | 713 | 713 | 711 | 712 | 713 |
|  | 762 | 710 | 711 | 712 | 712 | 710 | 711 | 712 | 712 | 710 | 711 | 712 |
| Column Address | 761 | (NC) | (NC) | (NC) | 711 | (NC) | (NC) | (NC) | 711 | (NC) | (NC) | 711 |
|  | 760 | (NC) | (NC) | 710 | 710 | (NC) | (NC) | 710 | 710 | (NC) | 710 | 710 |
|  | 759 | 709 | 709 | 709 | 709 | 709 | 709 | 709 | 709 | 709 | 709 | 709 |
|  | 758 | 708 | 708 | 708 | 708 | 708 | 708 | 708 | 708 | 708 | 708 | 708 |
|  | 757 | 707 | 707 | 707 | 707 | 707 | 707 | 707 | 707 | 707 | 707 | 707 |
|  | 756 | 706 | 706 | 706 | 706 | 706 | 706 | 706 | 706 | 706 | 706 | 706 |
|  | 755 | 705 | 705 | 705 | 705 | 705 | 705 | 705 | 705 | 705 | 705 | 705 |
|  | 754 | 704 | 704 | 704 | 704 | 704 | 704 | 704 | 704 | 704 | 704 | 704 |
|  | 753 | 703 | 703 | 703 | 703 | 703 | 703 | 703 | 703 | 703 | 703 | 703 |
|  | 752 | 702 | 702 | 702 | 702 | 702 | 702 | 702 | 702 | 702 | 702 | 702 |
|  | 751 | 701 | 701 | 701 | 701 | 701 | 701 | 701 | 701 | 701 | 701 | 701 |
|  | 750 | (NC) | (NC) | (NC) | (NC) | (NC) | (NC) | (NC) | 700 | 699 | 699 | 699 |

810 → Physical address terminals
820 → DDR x16 128MB; 821 → DDR x16 256MB; 822 → DDR x16 512MB; 823 → DDR x16 1GB
824 → DDR x8 128MB; 825 → DDR x8 256MB; 826 → DDR x8 512MB; 827 → DDR x8 1GB
828 → DDR x4 128MB; 829 → DDR x4 256MB; 830 → DDR x4 512MB
Byte Address Terminals

| | 831 | 832 | 833 | 834 | 835 | 836 | 837 | 838 | 839 | 840 | 841 | 842 | 843 | 844 |
|---|---|---|---|---|---|---|---|---|---|---|---|---|---|---|
| | DDR x4 1GB | DDR2 x16 256MB | DDR2 x16 512MB | DDR2 x16 1GB | DDR2 x16 2GB | DDR2 x16 4GB | DDR2 x8 256MB | DDR2 x8 512MB | DDR2 x8 1GB | DDR2 x8 2GB | mem x4 256MB | DDR2 x4 512MB | DDR2 x4 1GB | DDR2 x4 2GB |
| Byte Address Terminals | | | | | | | | | | | | | | |
|  | (NC) | (NC) | (NC) | 726 | 727 | 728 | (NC) | (NC) | 726 | 727 | (NC) | (NC) | 726 | 727 |
|  | 726 | 724 | 725 | 725 | 726 | 727 | 724 | 725 | 725 | 726 | 724 | 725 | 725 | 726 |
|  | 725 | 723 | 724 | 724 | 725 | 726 | 723 | 724 | 724 | 725 | 723 | 724 | 724 | 725 |
|  | (NC) | (NC) | (NC) | (NC) | (NC) | 725 | (NC) | (NC) | (NC) | 724 | (NC) | (NC) | (NC) | 724 |
|  | 724 | (NC) | (NC) | 723 | 724 | 724 | (NC) | (NC) | 723 | 723 | (NC) | (NC) | 723 | 723 |
|  | 723 | 722 | 723 | 722 | 723 | 723 | 722 | 722 | 722 | 722 | 722 | 722 | 722 | 722 |
|  | 722 | 721 | 722 | 721 | 722 | 722 | 721 | 721 | 721 | 721 | 721 | 721 | 721 | 721 |
|  | 721 | 720 | 721 | 720 | 721 | 721 | 720 | 720 | 720 | 720 | 720 | 720 | 720 | 720 |
|  | 720 | 719 | 720 | 719 | 720 | 720 | 719 | 719 | 719 | 719 | 719 | 719 | 719 | 719 |
|  | 719 | 718 | 719 | 718 | 719 | 719 | 718 | 718 | 718 | 718 | 718 | 718 | 718 | 718 |
|  | 718 | 717 | 718 | 717 | 718 | 718 | 717 | 717 | 717 | 717 | 717 | 717 | 717 | 717 |
|  | 717 | 716 | 717 | 716 | 717 | 717 | 716 | 716 | 716 | 716 | 716 | 716 | 716 | 716 |
|  | 716 | 715 | 716 | 715 | 716 | 716 | 715 | 715 | 715 | 715 | 715 | 715 | 715 | 715 |
|  | 715 | 714 | 715 | 714 | 715 | 715 | 714 | 714 | 714 | 714 | 714 | 714 | 714 | 714 |
|  | 714 | 713 | 714 | 713 | 714 | 714 | 713 | 713 | 713 | 713 | 713 | 713 | 713 | 713 |
|  | 713 | 712 | 713 | 712 | 713 | 713 | 712 | 712 | 712 | 712 | 712 | 712 | 712 | 712 |
|  | 712 | 711 | 712 | 711 | 712 | 712 | 711 | 711 | 711 | 711 | 711 | 711 | 711 | 711 |
|  | 711 | 710 | 711 | 710 | 711 | 711 | 710 | 710 | 710 | 710 | 710 | 710 | 710 | 710 |
|  | 710 | (NC) | 710 | (NC) | (NC) | (NC) | (NC) | (NC) | (NC) | (NC) | (NC) | (NC) | (NC) | (NC) |
|  | 709 | (NC) | 709 | 709 | 710 | (NC) | (NC) | 709 | 709 | 709 | 709 | 709 | 709 | 709 |
|  | 708 | 709 | 708 | 708 | 709 | 710 | 709 | 708 | 708 | 708 | 708 | 708 | 708 | 708 |
|  | 707 | 708 | 707 | 707 | 708 | 709 | 708 | 707 | 707 | 707 | 707 | 707 | 707 | 707 |
|  | 706 | 707 | 706 | 706 | 707 | 708 | 707 | 706 | 706 | 706 | 706 | 706 | 706 | 706 |
|  | 705 | 706 | 705 | 705 | 706 | 707 | 706 | 705 | 705 | 705 | 705 | 705 | 705 | 705 |
|  | 704 | 705 | 704 | 704 | 705 | 706 | 705 | 704 | 704 | 704 | 704 | 704 | 704 | 704 |
|  | 703 | 704 | 703 | 703 | 704 | 705 | 704 | 703 | 703 | 703 | 703 | 703 | 703 | 703 |
|  | 702 | 703 | 702 | 702 | 703 | 704 | 703 | 702 | 702 | 702 | 702 | 702 | 702 | 702 |
|  | 701 | 702 | 701 | 701 | 702 | 703 | 702 | 701 | 701 | 701 | 701 | 701 | 701 | 701 |
|  | 700 | 701 |  |  |  | 702 | 701 | 700 | 700 | 700 | 700 | 700 | 700 | 700 |
|  | 699 |  |  |  |  | 701 | 699 |  |  |  | 699 | 699 | 699 | 699 |

Fig. 8C

| | 845 | 846 | 847 | 848 | 849 | 850 | 851 | 852 | 853 | 854 | 855 | 856 | 857 | 858 |
|---|---|---|---|---|---|---|---|---|---|---|---|---|---|---|
| | DDR3 x16 512MB | DDR3 x16 1GB | DDR3 x16 2GB | DDR3 x16 4GB | DDR3 x8 512MB | DDR3 x8 1GB | DDR3 x8 2GB | DDR3 x4 512MB | DDR3 x4 1GB | DDR3 x4 2GB | MDDR x16 128MB | MDDR x16 256MB | MDDR x16 512MB | MDDR x16 1GB |
| Byte Address Terminals | | | | | | | | | | | | | | |
| | 725 | 726 | 727 | 728 | 725 | 726 | 727 | 725 | 726 | 727 | (NC) | (NC) | (NC) | (NC) |
| | 724 | 725 | 726 | 727 | 724 | 725 | 726 | 724 | 725 | 726 | 723 | 724 | 725 | 726 |
| | 723 | 724 | 725 | 726 | 723 | 724 | 725 | 723 | 724 | 725 | 722 | 723 | 724 | 725 |
| | (NC) | (NC) | 724 | 725 | (NC) | (NC) | 724 | (NC) | (NC) | 724 | (NC) | (NC) | (NC) | 724 |
| | (NC) | (NC) | 723 | 724 | (NC) | (NC) | 723 | (NC) | (NC) | 723 | 721 | 722 | 723 | 723 |
| | 722 | 723 | 722 | 723 | 722 | 723 | 722 | 722 | 723 | 722 | 720 | 721 | 722 | 722 |
| | 721 | 722 | 721 | 722 | 721 | 722 | 721 | 721 | 722 | 721 | 719 | 720 | 721 | 721 |
| | 720 | 721 | 720 | 721 | 720 | 721 | 720 | 720 | 721 | 720 | 718 | 719 | 720 | 720 |
| | 719 | 720 | 719 | 720 | 719 | 720 | 719 | 719 | 720 | 719 | 717 | 718 | 719 | 719 |
| | 718 | 719 | 718 | 719 | 718 | 719 | 718 | 718 | 719 | 718 | 716 | 717 | 718 | 718 |
| | 717 | 718 | 717 | 718 | 717 | 718 | 717 | 717 | 718 | 717 | 715 | 716 | 717 | 717 |
| | 716 | 717 | 716 | 717 | 716 | 717 | 716 | 716 | 717 | 716 | 714 | 715 | 716 | 716 |
| | 715 | 716 | 715 | 716 | 715 | 716 | 715 | 715 | 716 | 715 | 713 | 714 | 715 | 715 |
| | 714 | 715 | 714 | 715 | 714 | 715 | 714 | 714 | 715 | 714 | 712 | 713 | 714 | 714 |
| | 713 | 714 | 713 | 714 | 713 | 714 | 713 | 713 | 714 | 713 | 711 | 712 | 713 | 713 |
| | 712 | 713 | 712 | 713 | 712 | 713 | 712 | 712 | 713 | 712 | 710 | 711 | 712 | 712 |
| | 711 | 712 | 711 | 712 | 711 | 712 | 711 | 711 | 712 | 711 | (NC) | 710 | 711 | 711 |
| | 710 | 711 | 710 | 711 | 710 | 711 | 710 | 710 | 711 | 710 | (NC) | (NC) | (NC) | (NC) |
| | (NC) | (NC) | (NC) | (NC) | (NC) | (NC) | (NC) | (NC) | (NC) | (NC) | (NC) | (NC) | (NC) | (NC) |
| | (NC) | (NC) | (NC) | (NC) | (NC) | (NC) | (NC) | (NC) | (NC) | (NC) | 709 | 709 | 710 | 710 |
| | 709 | 710 | 710 | 710 | 709 | 710 | 709 | 709 | 710 | 709 | 708 | 708 | 709 | 709 |
| | 708 | 709 | 709 | 709 | 708 | 709 | 708 | 708 | 709 | 708 | 707 | 707 | 708 | 708 |
| | 707 | 708 | 708 | 708 | 707 | 708 | 707 | 707 | 708 | 707 | 706 | 706 | 707 | 707 |
| | 706 | 707 | 707 | 707 | 706 | 707 | 706 | 706 | 707 | 706 | 705 | 705 | 706 | 706 |
| | 705 | 706 | 706 | 706 | 705 | 706 | 705 | 705 | 706 | 705 | 704 | 704 | 705 | 705 |
| | 704 | 705 | 705 | 705 | 704 | 705 | 704 | 704 | 705 | 704 | 703 | 703 | 704 | 704 |
| | 703 | 704 | 704 | 704 | 703 | 704 | 703 | 703 | 704 | 703 | 702 | 702 | 703 | 703 |
| | 702 | 703 | 703 | 703 | 702 | 703 | 702 | 702 | 703 | 702 | 701 | 701 | 702 | 702 |
| | 701 | 702 | 702 | 702 | 701 | 702 | 701 | 701 | 702 | 701 | | | 701 | 701 |
| | | 701 | 701 | 701 | | 701 | 700 | 700 | 700 | 700 | | | | |
| | | | | | | | | 699 | 699 | 699 | | | | |

METHOD AND APPARATUS FOR CONFIGURABLE ADDRESS TRANSLATION

CROSS-REFERENCE TO RELATED APPLICATIONS

This application claims the priority under 35 U.S.C. §119 of U.S. Provisional Patent Application No. 61/148,926 filed on Jan. 31, 2009 and entitled "Apparatus and Method for a Memory Controller", and also U.S. Provisional Patent Application No. 61/148,927 filed on Jan. 31, 2009 and entitled "Architecture for Advanced Integrated Circuit Providing Good Performance and Low Cost". The disclosures of both of these provisional patent applications are hereby incorporated herein by reference in their entirety.

FIELD OF THE INVENTION

An embodiment of the invention relates to techniques for handling memory addresses. More particularly, an embodiment of the invention relates to techniques for translating a memory address from one format to a different format.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

In some applications, a PLD may need to be coupled to an external memory device, such as a dynamic random access memory (DRAM) device. Circuitry internal to the PLD may produce a memory address in a format referred to as a byte address, meaning that there is a unique address for each accessible byte of data within the memory. However, an external memory device will often have address inputs that require an address to be in a format different from the byte address format. In fact, different types of external memory devices require addresses in various different formats. For example, external DRAM memory devices often require that each memory address be provided in a format involving separate bank, row and column portions, and different external DRAM memory devices can have different requirements as to how bits of a byte address are to be split up into the bank, row and column portions. For any given external memory device, this is referred to as the physical address format for that memory device.

Each time circuitry internal to a PLD outputs a byte address, the PLD needs to translate or map the bits of that byte address into the particular physical address format of whatever external memory device happens to be currently coupled to the PLD. Although existing techniques for mapping or translating addresses have been generally adequate for intended purposes, they have not been entirely satisfactory in all respects.

SUMMARY OF THE INVENTION

One embodiment of the invention involves an apparatus having a device with programmable circuitry that includes: a first interface having a plurality of first address terminals; a second interface having a plurality of second address terminals; and a configurable interconnect structure coupled between the first and second interfaces, the interconnect structure being configurable during field programming to electrically couple each of the address terminals in a first subset of the first address terminals to respective address terminals in a second subset of the second address terminals according to a selected one of a plurality of different mapping functions.

Another embodiment of the invention relates to a method that involves a device having programmable circuitry that includes a first interface having a plurality of first address terminals, a second interface having a plurality of second address terminals, and a configurable interconnect structure coupled between the first and second interfaces. The method includes configuring the interconnect structure during field programming of the device in a manner so that each of the address terminals in a first subset of the first address terminals is coupled to respective address terminals in a second subset of the second address terminals according to a selected one of a plurality of different mapping functions.

DETAILED DESCRIPTION

Figure 1:
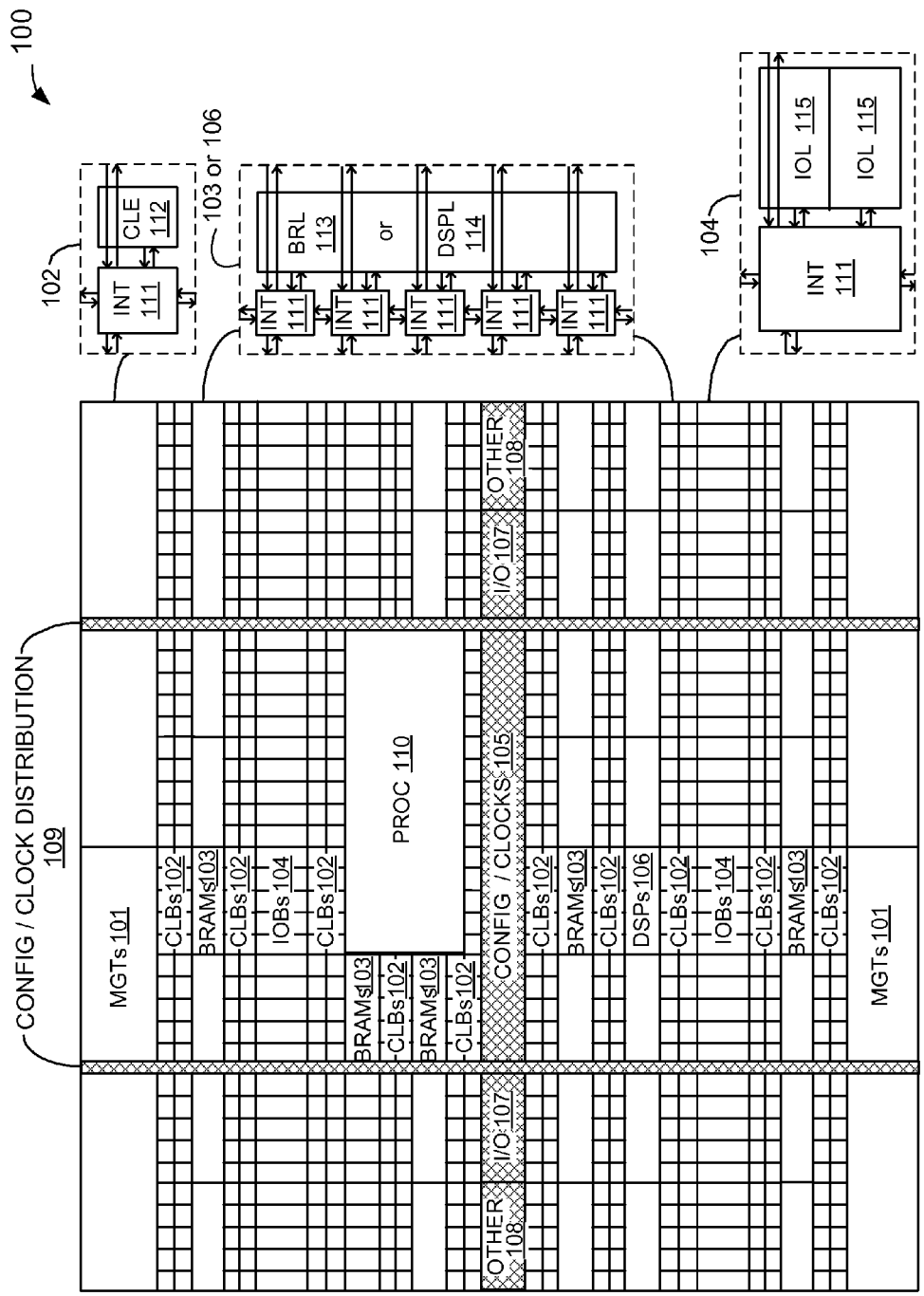
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
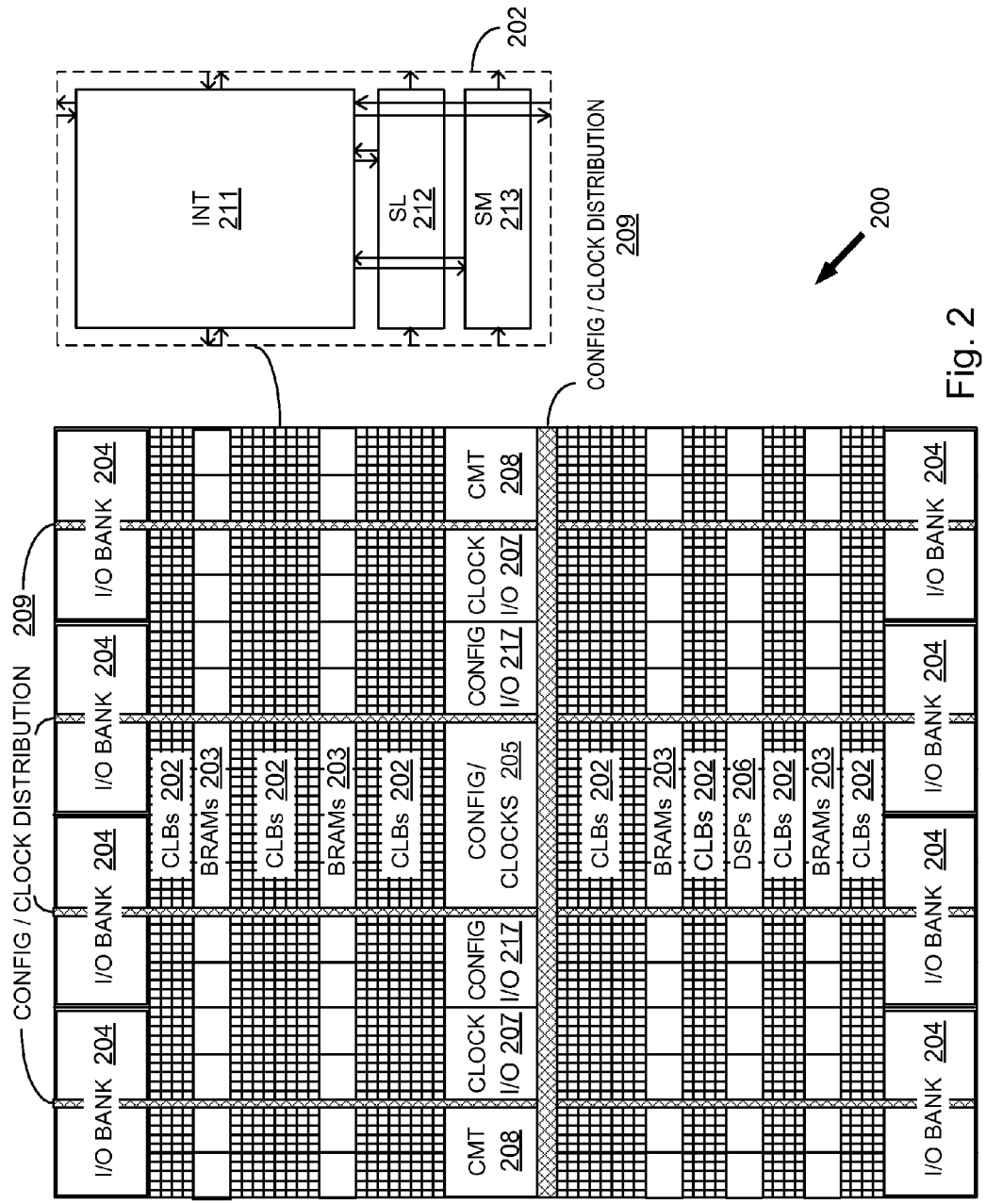
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
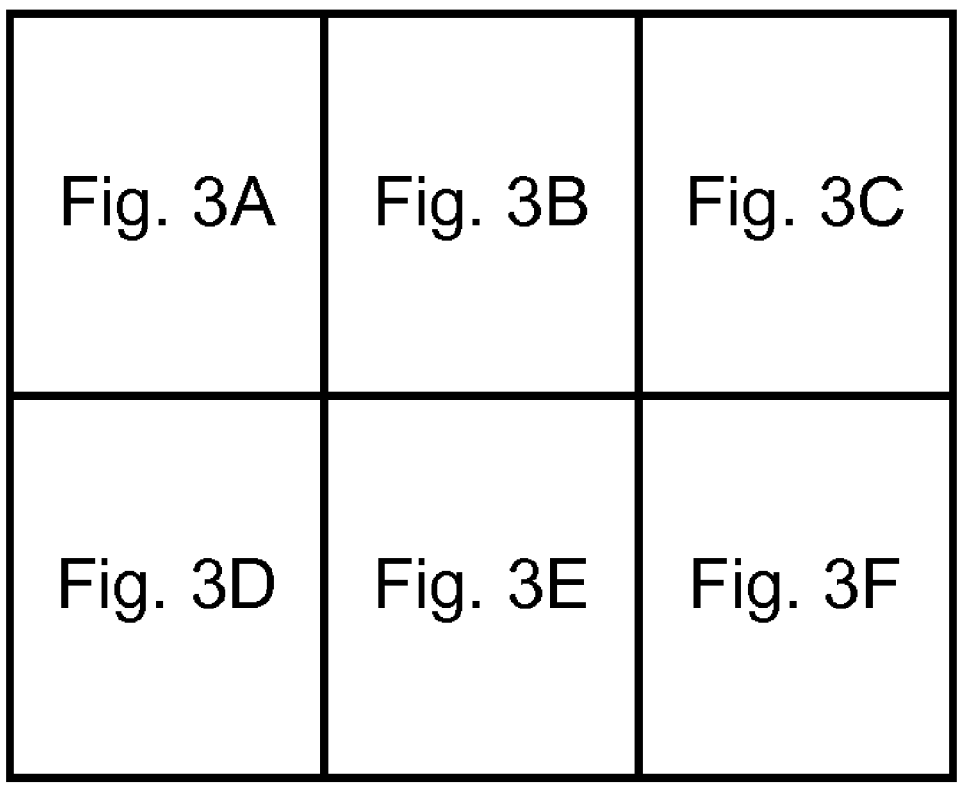
FIG. 3 (which includes FIGS. 3A-3F) is a block diagram showing an apparatus in the form of a circuit that includes the FPGA of FIG. 1 and a dynamic random access memory (DRAM), where the FPGA includes a memory controller circuit and an FPGA fabric.
Figure 3D:
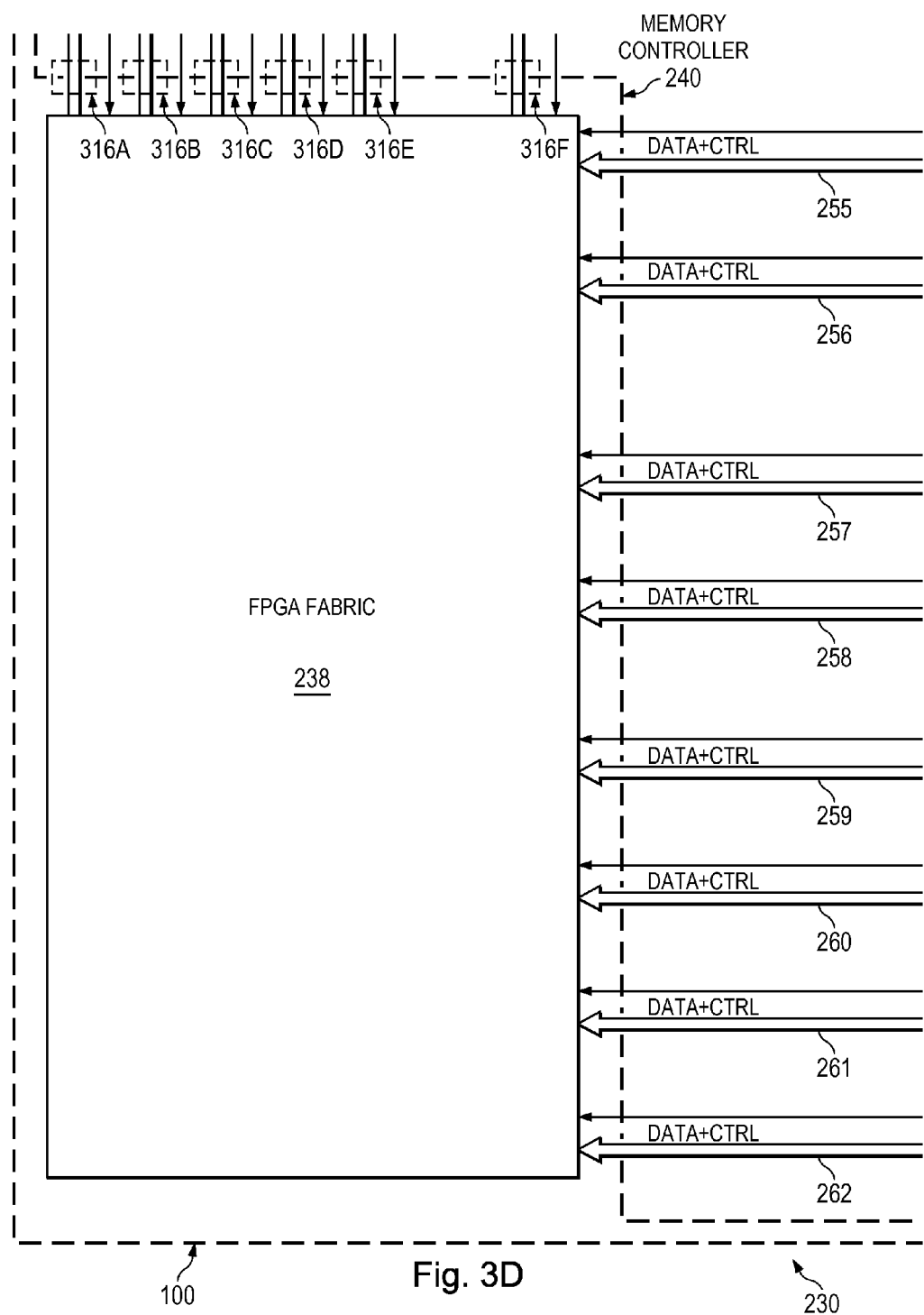
Figure 3F:
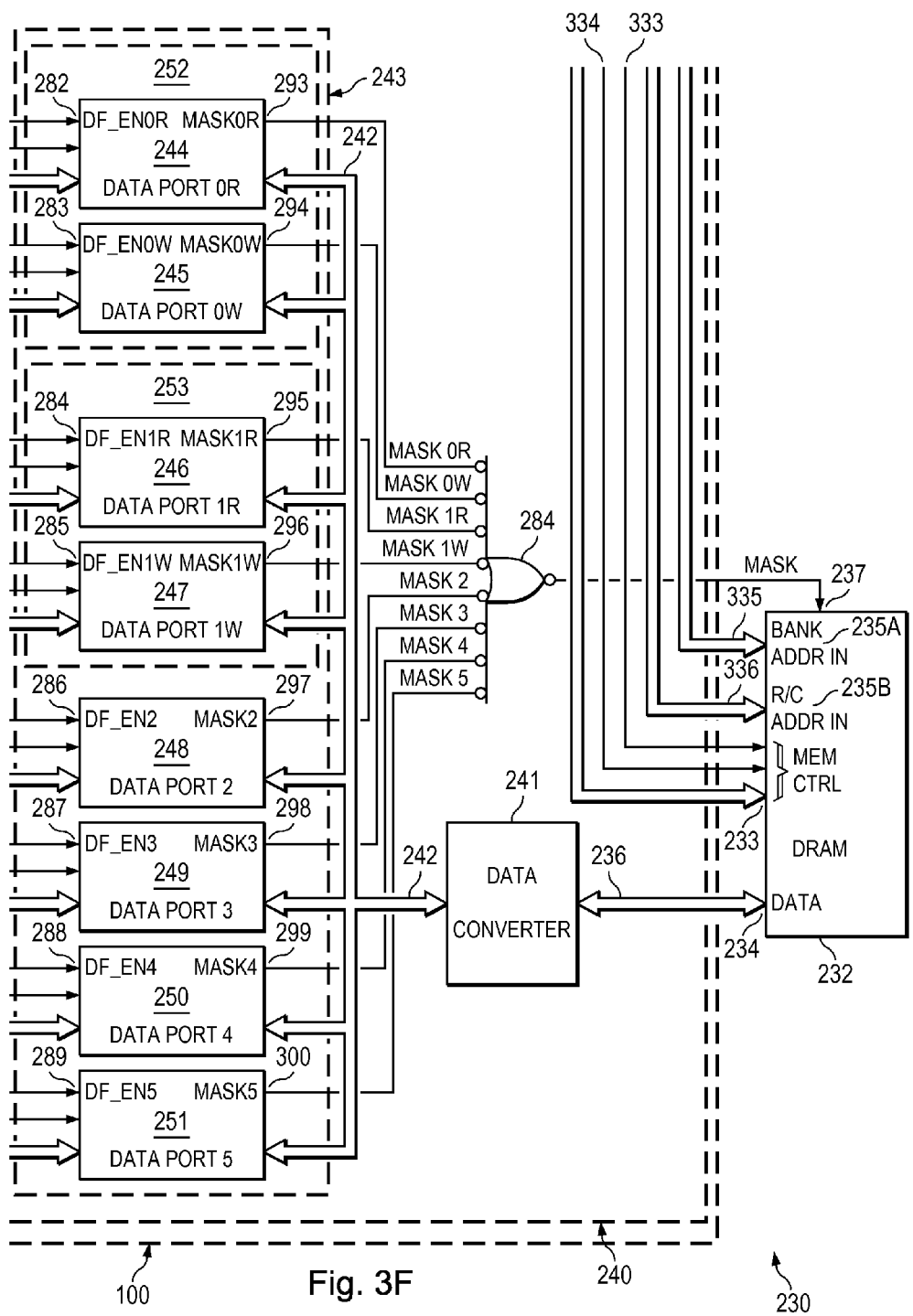

FIG. 3 (which includes FIGS. 3A-3F) is a block diagram showing an apparatus 230 in the form of an integrated circuit that includes the FPGA 100 (FIG. 1), and showing a dynamic random access memory (DRAM) 232. FIG. 3 does not show everything in the FPGA 100, but instead shows only portions that facilitate an understanding of the disclosed embodiment of the invention. The FPGA in FIG. 3 could alternatively be the FPGA 200 of FIG. 2.

The DRAM 232 is a standard double data rate (DDR) device with a standard memory interface. Alternatively, the DRAM 232 could be a memory of a different double data rate type (DDR2, DDR3, LPDDR or mobile DDR). As another alternative, the DRAM 232 could be any of a variety of other memory devices. For example, the DRAM 232 could be a memory of the type known as single data rate (SDR). The memory interface of the DRAM 232 includes a memory control input 233 for receiving MEM CTRL signals, a data interface 234 for receiving and outputting data, a bank address input BANK ADDR IN 235A that receives a bank address portion of a memory address, and a row/column address input R/C ADDR IN 235B that receives row address and column address portions of the memory address. The data interface 234 is coupled to a data bus 236. The DRAM 232 also includes an input 237 for receiving a signal MASK. As discussed in more detail later, the signal MASK is used during a memory write operation to advise the DRAM 232 to ignore selected memory locations that are not to be written.

The DRAM 232 has a DRAM PIN_COUNT that is the width of each memory location in the DRAM, and that is the width of the data interface 234 of the DRAM 232. For purposes of the present discussion, it is assumed that the DRAM PIN_COUNT is 8 bits. However, in alternative embodiments, the DRAM PIN_COUNT could be 4 or 16 bits, or any other suitable number of bits. In addition, the DRAM 232 has a memory burst length DRAM_BL, which is the number of memory words accessed during each memory access carried out by the DRAM 232. For purposes of the present discussion, it is assumed that the memory burst length DRAM_BL is 8 words. However, the DRAM_BL could alternatively be 4 words, or any other suitable number of memory words. During each memory access, there are successive time slots equal in number to the value of DRAM_BL, and during each time slot the DRAM can read or write one word. Thus, the DRAM 232 has 8 time slots during which it can read eight 8-bit words for a READ command, or write eight 8-bit words for a WRITE command. As a practical matter, during a WRITE command, less than 8 words may actually be written into the memory (as discussed in more detail later), but all 8 time slots still occur. For each memory access, the DRAM 232 accesses up to eight 8-bit words, or 64 bits in total. Accordingly, in order to transfer more than 64 bits of data to or from the memory, a data transfer sequence involving an integer multiple of memory access cycles is needed.

The DRAM 232 is conceptually divided into a series of contiguous blocks each equal in size to the DRAM_BL (64 bits), and each having respective start and end memory address boundaries. READ and WRITE accesses each need to start and end on a boundary. In instances where either the start or end memory address of a READ or WRITE command does not coincide with a boundary, the system ignores portions of memory blocks that are accessed during a READ, or in the case of a WRITE uses the signal MASK to tell the DRAM 232 to ignore selected locations that are not to be written during a memory access.

In more detail, there are four different data transfer scenarios with regard to memory address boundaries. For example, a data transfer may have start and end memory addresses that each coincide with a memory boundary. In this case, no masking is needed. In another scenario, a data transfer may have a start memory address that is aligned with a memory boundary, and an end memory address that falls between memory boundaries. In this case, post-masking is carried out to ignore memory locations between the end memory address and the closest subsequent memory address boundary. In yet another scenario, a data transfer may have a start memory address that falls between memory boundaries and an end memory address that is aligned with a memory address boundary. In this case, pre-masking is carried out to ignore memory locations between the start memory address and the closest previous memory address boundary. In a further scenario, a data transfer may have start and end memory addresses that each fall between memory boundaries. In this case, both pre-masking and post-masking are needed.

The FPGA 100 includes an FPGA fabric 238, and a memory controller 240 that is a data transfer portion. In regard to data to be written into or read from the DRAM 232, the FPGA fabric 238 is configurable to transfer data using one or more predetermined word widths. For example, the FPGA fabric 238 can be configured to receive and transmit data having a word width of 32, 64, or 128 bits. Alternatively, the FPGA fabric 238 could be designed to receive or transmit words having a width of any other number of bits. In addition, the FPGA fabric 238 can be configured to receive and transmit data having a first word width that is one of 32, 64, and 128 bits, and to also receive and transmit other data having a second word width that is a different one of 32, 64, and 128 bits. The memory controller 240 facilitates transfers of data between the FPGA fabric 238 and the DRAM 232. The memory controller 240 includes memory cells 239 that are configurable structure. The memory cells 239 store information about the DRAM 232 and the memory controller 240. In particular, the memory cells 239 store the memory burst length DRAM_BL and the pin count DRAM PIN_COUNT of the DRAM 232. Also, the memory cells 239 store data port configuration information for some data ports that exist in the memory controller 240, and that are discussed in more detail later. The memory cells 239 also store priority information (command port priorities) for some command ports that exist within the memory controller 240, and that are described in more detail later. The information stored in the memory cells 239 is specified by a user during field programming of the FPGA.

The memory controller 240 includes a portion that is a data converter 241. The data converter 241 has an interface that is coupled to the data bus 236. Also, the data converter 241 has another interface that is coupled to a data bus 242 that is 32 bits wide. When the DRAM 232 is a DDR device, the data converter 241 converts data to and from DDR format data for WRITE and READ data transfers between the memory controller 240 and the DRAM 232. For a WRITE data transfer, the data converter 241 takes each word received from other circuitry within the memory controller, conFigs. it as DDR data by splitting it into two halves, and then successively passes the two halves across the data bus 236 to the DRAM 232. For a READ data transfer, the data converter 241 captures each data word output by the DRAM 232, and then synchronizes the word to an internal clock signal of the memory controller 240. The data converter 241 takes two successive data words received from the DRAM 232 (DDR data), and then combines them into a single larger data word that the data converter then passes on to other circuitry within the memory controller.

In further detail, and as discussed above, it is being assumed for purposes of this discussion that the DRAM 232 in the disclosed embodiment has a pin count of 8 bits. With respect to data transfers between the DRAM 232 and the data converter 241, 8 bits of data are transferred on each edge of each pulse of a not-illustrated memory clock signal known as the DQS signal. Accordingly, on each pulse of the DQS signal, a total of 16 bits of data is transferred from the DRAM 232 to the data converter 241. Therefore, for a READ data transfer, the data converter 241 combines two successive 8-bit data words into a single 16-bit data word that is then passed on to other circuitry within the memory controller 240 over the data bus 242. By way of analogy, for a WRITE data transfer, the data converter 241 takes each 16-bit data word arriving over the data bus 242 and divides it into two 8-bit data words (DDR data) that are then sent successively over the data bus 236 to the DRAM 232.

As noted earlier, it would alternatively be possible to replace the DDR DRAM memory device 232 with a memory of the type known as a single data rate (SDR) device. In that situation, for both READ and WRITE data transfers, the data converter 241 would not alter data that passes through it.

The memory controller 240 includes a data storage portion 243 that is coupled between the FPGA fabric 238 and the data converter 241, and that is configured by a user during field programming of the FPGA. The data storage portion 243 temporarily stores data that is being transferred between the FPGA fabric 238 and the DRAM 232. The data storage portion 243 includes eight independently controlled data ports 244-251 that are each a first-in-first-out (FIFO) storage device serving as a storage element. Each of the data ports 244-251 can store up to 64 words that are each 32 bits. In addition, the data ports 244-251 can optionally be concatenated during field configuration. For example, two of the 32-bit data ports 244-251 can be concatenated to form a 64-bit data port, or four of the 32-bit data ports 244-251 can be concatenated to form a 128-bit data port. Specifically, the data storage portion 243 can be configured to have (1) only 32-bit data ports, (2) a combination of 32-bit and 64-bit data ports, (3) only 64-bit data ports, or (4) only 128-bit data ports. In this manner, the memory controller 240 is configurable to facilitate transfers of fabric data words having 32, 64, and/or 128 bits.

The data ports 244 and 246 provide unidirectional storage for data transfers from the DRAM 232 to the FPGA fabric 238 (READ). The data ports 245 and 247 provide unidirectional storage for data transfers from the FPGA fabric 238 to the DRAM 232 (WRITE). The pair of data ports 244 and 245 form a bidirectional dual data port 252, and the pair of data ports 246 and 247 form a bidirectional dual data port 253. The data ports 248-251 also provide for unidirectional storage, and are each configurable during field programming to temporarily store data during either READ transfers or WRITE transfers. The ports 248-251 must each be designated as either a read port or a write port during field configuration, and that designation does not thereafter change. Accordingly, there are a variety of possible configurations for the data storage portion 243.

In more detail, in one configuration the data storage portion 243 can be configured to have only 32-bit data storage elements. In this scenario, the data ports 244 and 246 each provide unidirectional storage for READ data transfers, and the data ports 245 and 247 each provide unidirectional storage for WRITE data transfers. Moreover, the other four data ports 248-251 can each be independently configured to provide unidirectional storage for either READ data transfers or WRITE data transfers. Thus, the four data ports 248-251 can be configured as (1) four data ports that each provide unidirectional storage for READ data transfers, (2) one data port that provides unidirectional storage for READ data transfers and three data ports that provide unidirectional storage for WRITE data transfers, (3) two data ports that provide unidirectional storage for READ data transfers and two data ports that provide unidirectional storage for WRITE data transfers, (4) three data ports that provide unidirectional storage for READ data transfers and one data port that provides unidirectional storage for WRITE data transfers, or (5) four data ports that each provide unidirectional storage for WRITE data transfers.

In another scenario, the data storage portion 243 is configured to have 64-bit data storage elements. For example, the data ports 244 and 246 can be concatenated and the data ports 245 and 247 can be concatenated to form two 64-bit data storage elements that respectively provide for 64-bit READ data transfers and 64-bit WRITE data transfers. When the data ports 244-247 are concatenated to form two 64-bit storage elements, the data ports 248-251 can each be configured to be a 32-bit data port, or can be configured to define two 64-bit storage elements. For example, the data ports 248 and 250 can be concatenated to form a data storage element that provides for 64-bit READ data transfers, and the data ports 249 and 251 can be concatenated to form a data storage element that provides for 64-bit WRITE data transfers.

In yet another scenario, the data storage portion 243 is configured to have only 128-bit storage elements. In this scenario, the four 32-bit data ports 244, 246, 248, and 250 are concatenated to form a 128-bit data port for READ data transfers, and the four 32-bit data ports 245, 247, 249, and 251 are concatenated to form a 128-bit data port for WRITE data transfers.

For purposes of the discussion that follows, assume that in FIG. 3 the data storage portion 243 is configured during field programming to provide a combination of 32-bit and 64-bit data storage elements. In particular, assume that the data ports 244 and 246 are concatenated and that the data ports 245 and 247 are concatenated, in order to form two 64-bit storage elements that respectively provide temporary storage for READ and WRITE data transfers. In addition, assume the data ports 248 and 250 are each configured to provide temporary 32-bit storage for READ data transfers, while the data ports 249 and 251 are each configured to provide temporary 32-bit storage for WRITE data transfers.

Each of the data ports 244-251 produces a status flag signal STATUS FLAG that is supplied to the FPGA fabric 238. In particular, status flag signals STATUS FLAG 0R, STATUS FLAG 0W, STATUS FLAG 1R, STATUS FLAG 1W, STATUS FLAG 2, STATUS FLAG 3, STATUS FLAG 4, and STATUS FLAG 5 are respectively produced by the data ports 244-251. Each STATUS FLAG signal indicates that the associated data port is empty if that data port is configured for READs, or indicates that the associated data port is full if it is configured for WRITEs. If two or four data ports are concatenated, then only one STATUS FLAG signal corresponding to the last of those concatenated data ports is actually used. For example, in the configuration assumed here, the signal STATUS FLAG 1R for data port 246 is used to indicate when concatenated data ports 244 and 246 are empty, while STATUS FLAG 0R for data port 244 is ignored. Similarly, the signal STATUS FLAG 1W for data port 247 is used to indicate when concatenated data ports 245 and 247 are full, while STATUS FLAG 0W for data port 245 is ignored. Each of the STATUS FLAGs from the data ports 248 and 250 indicates when that data port is empty. Also, each of the STATUS FLAGs from the data ports 249 and 251 indicates when that data port is full.

Each of the data ports 244-251 is coupled to a respective one of eight bidirectional buses 255-262 that each carry control signals and 32 bits of data between that data port and the FPGA fabric 238. Each of the buses 255-262 and its associated STATUS FLAG signal serve as a respective interface between the fabric 238 and a respective one of the data ports 244-251. Each of the data ports 244-251 is also coupled to the common data bus 242. Also, the data ports 244-251 have respective enable inputs 282-289 for receiving respective active-high enable signals DF_EN_0R, DF_EN_0W, DF_EN_1R, DF_EN_1W, DF_EN_2, DF_EN_3, DF_EN_4, and DF_EN_5. Each of these enable signals independently enables and disables the corresponding data port 244-251 to accept or output data.

Each of the data ports 244-251 has a respective one of eight mask outputs 293-300 at which it can produce a respective one of eight active-high signals MASK 0R, MASK 0W, MASK 1R, MASK 1W, MASK 2, MASK 3, MASK 4, and MASK 5. These signals respectively depend on the corresponding enable signals. For example, in the case of data port 244, if the enable signal DF_EN_0R that is received at the enable input 282 is asserted, the mask signal MASK OR at the mask output 293 is set to a logic low. Conversely, if the enable signal DF_EN_0R that is received at the enable input 282 is deasserted, the mask signal MASK 0R at the mask output 293 is set to a logic high. The memory controller 240 includes a NOR gate 284 with 8 inverting inputs that are coupled to the respective mask outputs 293-300 of the data ports 244-251. The NOR gate 284 outputs a signal MASK that is supplied to the mask input 237 of the DRAM 232.

An explanation will now be provided of the operation of the data storage portion 243 for a data transfer of a 64-bit word from the FPGA fabric 238 to the DRAM 232 (for a memory WRITE). As discussed above, it is being assumed for the sake of this discussion that the data ports 245 and 247 are concatenated to form a 64-bit storage element. Assume that the 64-bits of data are to be supplied through the 64-bit data storage element defined by the concatenated data ports 245 and 247. The FPGA fabric 238 first checks the signal STATUS FLAG1W from data port 247 in order to determine whether data ports 245 and 247 are currently full. If they are, then the fabric 238 waits. Otherwise, the fabric 238 can put data into the concatenated data ports 245 and 247. More specifically, the FPGA fabric 238 simultaneously transfers a first half of the 64-bits in parallel across the data bus 255 and into the data port 245, while transferring the second half of the 64 bits in parallel across the data bus 256 and into the data port 247. Later, the data ports 245 and 247 are sequentially enabled so that the 32 bits of data stored in each of those data ports are sequentially transferred across the data bus 242 and into the data converter 241 in successive groups of sixteen bits. As previously discussed, the data converter 241 splits each 16-bit word into two 8-bit words that are then transferred successively across the data bus 236 and into the DRAM 232.

In greater detail, first the enable signal DF_EN_0W is asserted to enable the data port 245 so that the 32 bits in that data port are transferred in two successive groups of sixteen bits to the data converter 241. The data converter 241 divides each 16-bit data word received from the data port 245 into a pair of 8-bit data words that conform with the DDR standard, and then successively transfers these two 8-bit data words over the data bus 236 to the DRAM 232. The data port 245 is enabled until all 32 bits therein have been transferred. Then, the enable signal DF_EN_0W is deasserted to disable the data port 245, and the enable signal DF_EN_1W is asserted to enable the data port 247, so that the 32 bits of data in that data port are transferred in two successive groups of sixteen bits over the data bus 242 and into the data converter 241. The data converter 241 divides each group of 16-bit data words received from the data port 247 into a pair of 8-bit data words that conform to the DDR standard, and transfers the resulting DDR data over the data bus 236 to the DRAM 232. The data port 247 is enabled until all 32 bits have been transferred. This is one example of how data is transferred from the FPGA fabric 238 to the DRAM 232.

An explanation will now be provided of the operation of the data storage portion 243 for a data transfer of 64 bits of data from the DRAM 232 to the FPGA fabric 238 (READ). As discussed above, it is being assumed for the sake of this discussion that the data ports 244 and 246 are concatenated to form a 64-bit storage element. Assume that the FPGA fabric 238 decides the 64-bit data storage element defined by the concatenated data ports 244 and 246 will be used for the transfer. The DRAM 232 supplies the 64 bits of data to the data converter 241 in the form of four successive pairs of 8-bit words. As previously explained, the data converter 241 combines each incoming pair of 8-bit words into a 16-bit word, and then supplies the 64 bits of data over the data bus 242 to the data ports 244 and 246 as successive words or groups of 16 bits. The enable signals DF_EN_0R and DF_EN_1R are sequentially asserted so that the data ports 244 and 246 are sequentially enabled to accept and store this data. First the enable signal DF_EN_0R is asserted so that the data port 244 receives data from the bus 242 in two successive groups of sixteen bits, until the 32-bit width of the data port 244 is filled. Then, the enable signal DF_EN_0R is deasserted so that the data port 244 is disabled, and the enable signal DF_EN_1R is asserted so that the data port 246 is enabled and can receive the next 32 bits of data. This is one example of how data is loaded into the storage portion 243 during a READ transfer. This data is temporarily stored in the data storage portion 243, until the FPGA fabric 238 retrieves it. In this regard, the signal STATUS FLAG 1R from data port 246 indicates to the fabric 238 whether the concatenated data ports 244 and 246 are empty or contain some data. If STATUS FLAG 1R indicates that they contain data, then in due course the FPGA fabric 238 will retrieve this data from the data ports 244 and 246 in a manner so that all 64 bits of data are simultaneously transferred in parallel from the data ports 244 and 246 over the two respective buses 255 and 257 to the fabric.

The memory controller 240 further includes a command storage portion 306 that is coupled to the FPGA fabric 238, and that includes six command ports 309-314. The command ports 309-314 each have an input that is coupled to a respective one of six command data lines CMD 0, CMD 1, CMD 2, CMD 3, CMD 4, and CMD 5 from the FPGA fabric 238. Each of these command data lines CMD 0-CMD 5 includes a plurality of lines that carry data signals, address signals, and control signals. The command data lines CMD O-CMD 5 extend through interconnection sections 316A-316L. The interconnection sections 316A-316L are a part of an interconnect structure that will be discussed in more detail later. The interconnection sections 316A-316F have respective interfaces with the FPGA fabric 238, and the interconnection sections 316G-316L have respective interfaces with the command ports 309-314 of the command storage portion 306.

Memory addresses passing through each of the interfaces between the FPGA fabric 238 and the interconnection sections 316A-316F have a format that is different from the format of memory addresses passing through each of the interfaces between the interconnection sections 316G-316L and the command ports 309-314. The interconnect structure that includes the interconnection sections 316A-316L performs memory address translation or mapping, so that memory addresses coming from the FPGA fabric 238 with one format are each translated or mapped into a memory address having a different format when received at the command storage portion 306. The interconnect structure, the interfaces, and the memory address translation will be discussed in more detail later.

The command storage portion 306 receives commands from the FPGA fabric 238 that call for transfers of data between the FPGA fabric 238 and the DRAM 232. The six command ports 309-314 include two command ports that each correspond to a respective one of the bidirectional dual data ports 252 and 253, and include four other command ports that each correspond to a respective one of the other four data ports 248-251. The command ports 309-314 are each FIFOs that can store information for up to 4 commands, for later processing by the memory controller 240.

The command ports 309-314 each have an input for receiving a respective one of six active-high signals CMD STATUS FLAG 0, CMD STATUS FLAG 1, CMD STATUS FLAG 2, CMD STATUS FLAG 3, CMD STATUS FLAG 4, and CMD STATUS FLAG 5. Each of these signals indicates to the associated command port that a command is being read from that command port. Moreover, the command ports 309-314 each have an output that provides a respective one of six active-high signals FULL FLAG 0, FULL FLAG 1, FULL FLAG 2, FULL FLAG 3, FULL FLAG 4, and FULL FLAG 5 to the FPGA fabric 238. Each of these FULL FLAG signals indicates when the associated command port is full. In addition, the command ports 309-314 each have an output that provides a respective one of six active-high signals EMPTY FLAG 0, EMPTY FLAG 1, EMPTY FLAG 2, EMPTY FLAG 3, EMPTY FLAG 4, and EMPTY FLAG 5. Each of these EMPTY FLAG signals indicates when the corresponding command port is empty.

The command port priorities stored in the memory cells 239 inform the memory controller 240 of a user-specified order in which the command ports should be polled. In the course of operation of the memory controller 240, the command ports are checked in an order that is specified by the command priorities, and the first command port that is not empty is selected. In that regard, the memory controller 240 includes a command selector 318 that is a six-to-one selector for selecting one of the six command ports 309-314. The command selector 318 has six inputs that are each coupled to a respective one of the command ports 309-314, has a select input that receives a 3-bit select signal CMD_PORT_SEL, and has an output to which it can supply a command CMD from the selected command port.

The memory controller 240 includes a controller core 319 that is coupled between the command selector 318 and the DRAM 232. The controller core 319 includes a command request output 320 that outputs a signal CMD REQ to request that a command be read from the command storage portion 306, as discussed in more detail later. The controller core 319 also has an input 321 that receives a signal CMD IN. The signal CMD IN indicates to the controller core 319 that a command is currently being read from the command storage portion 306. The controller core 319 further includes a command input 324 that is coupled to the output of the selector 318, and that receives a command CMD. In addition, the controller core 319 includes a command count input 325 that receives a signal CMD_CNT. The signal CMD_CNT is received when a command is being read from the command storage portion 306, and indicates the minimum number of memory access cycles that will need to be executed by the DRAM 232 in order to carry out the data transfer request in the selected command. The controller core 319 also includes a FIFO 328 that is a storage section for temporarily storing information about each command received from the output of the command selector 318. The FIFO 328 stores up to 4 words, and therefore can store information related to up to 4 commands received from the output of the command selector 318. This information is later used by the controller core 319 when executing those commands. For example, for each command, the FIFO 328 stores a memory address from the command, and information indicating whether the command is a read or write request. Also, the FIFO 328 stores the CMD_CNT value provided for that command at the command count input 325.

The controller core 319 has outputs that supply control and addressing signals to the DRAM 232 for execution of a command. In particular, the controller core 319 includes a memory control output 329 that supplies the signals MEM CTRL to the memory control input 233 of the DRAM 232. The signals MEM CTRL include a row address strobe (RAS) signal and a column address strobe (CAS) signal that are carried by a row address strobe line 333 and a column address strobe line 334, respectively. Moreover, the controller core 319 includes a bank address output BANK ADDR OUT 330A and a row/column address output R/C ADDR OUT 330B. The bank address output 330A supplies a bank address portion of a memory address through bank address lines 335 to the bank address input BANK ADDR IN 235A of the DRAM 232. The row/column address output R/C ADDR OUT 330B supplies row address and column address portions of the memory address in succession through row/column address lines 336 to the row/column address input R/C ADDR IN 235B of the DRAM 232. In addition, the controller core 319 includes an output 331 at which it produces a memory read enable signal MEMORY READ EN that is actuated at the start of a memory READ. Also, the controller core 319 includes an output 332 at which it produces a memory write enable signal MEMORY WRITE EN that is actuated at the start of a memory WRITE.

During operation, the controller core 319 requests a command by producing the signal CMD REQ at the output 320. In due course, the controller core 319 receives the signal CMD IN at the input 321, which indicates that a command is being read from the command storage portion 306 and is present at the command input 324 of the controller core 319. The controller core 319 also receives the signal CMD_CNT at its input 325. The controller core 319 stores in its FIFO 328 some of the information from the command that is being read in, along with the CMD_CNT value, as discussed above. The controller core 319 repeats this process, storing information and CMD_CNT values for successive commands, and trying to keep the FIFO 328 filled with information for up to four different commands. Meanwhile, the controller core 319 is separately and independently executing commands as they reach the end of the FIFO 328. When the controller core 319 is ready to execute a command that has reached the end of the FIFO 328, the controller core 319 uses the information about that command from the FIFO 328 to supply appropriate addressing and control signals to the DRAM 232.

The memory controller 240 includes an arbiter 338 that determines the order in which commands from the various command ports will be read in and executed, based on factors that include the command port priority information stored in the memory cells 239. The arbiter 338 also controls the data ports 244-251, in order to cause them to partially assemble and disassemble data that is being transferred between the FPGA fabric 238 and the DRAM 232, in the manner outlined earlier.

The arbiter 338 is coupled to the command storage portion 306, the command selector 318, the memory cells 239, the controller core 319, and the data storage portion 243. The arbiter has a set of inputs 343-346 that are coupled to the memory cells 239, and that respectively receive the memory burst length DRAM_BL, the memory pin count DRAM PIN_COUNT, the data port configuration, and the command priorities. The arbiter 338 also has a set of command port empty flag inputs 350-355 that each receive a respective one of the EMPTY FLAG signals from the command ports 309-314. These signals let the arbiter know whether or not each of the command ports 309-314 is currently empty. In addition, the arbiter 338 has a command request input 359 that receives the signal CMD REQ from the command request output 320 of the controller core 319. In response to receiving the signal CMD REQ from the controller core 319, the arbiter 338 selects one of the command ports 309-314, and reads a command from it, as discussed below.

The arbiter 338 has a command port select output 360 at which it produces the select signal CMD_PORT_SEL for the control input of the six-to-one selector 318. The signal CMD_PORT_SEL selects one of the command ports 309-314 to be read, based in part on the command port priorities that are stored in the memory cells 239, and based in part on the EMPTY FLAG signals. The handling of command port priorities is discussed in more detail later.

The arbiter 338 further includes a command input 361 that is coupled to the output of the selector 318, and that receives the selected command CMD. Moreover, the arbiter 338 includes some FIFOs 362 that store information about a command received at the command input 361, along with some other information that is determined by the arbiter, as discussed in more detail later. Each of the FIFOs 362 can store information relating to up to 4 commands.

In addition, the arbiter 338 includes a set of command port status outputs 364-369 that each supply a respective one of the six signals CMD STATUS FLAGS 0-5 to a respective one of the command ports 309-314. The arbiter 338 has an output 375 at which it outputs the signal CMD IN to the controller core 319, in order to indicate that a command is being read from the command storage portion 306. Moreover, the arbiter 338 includes a command count output 376 at which it supplies the CMD_CNT value to the command count input 325 of the controller core 319.

The arbiter 338 has a memory read enable input 381 that is coupled to the memory read enable output 331 of the controller core 319, and that receives the signal MEMORY READ EN. In addition, the arbiter 338 has a memory write enable input 382 that is coupled to the memory write enable output 332 of the controller core 319, and that receives the signal MEMORY WRITE EN. The arbiter also has a SUBPORT FIFO 383 that stores the addresses of selected data ports 244-251 that are currently being used for a data transfer. The SUBPORT FIFO 383 is 4 words deep, and therefore can store the addresses of up to four data ports. For example, during a 32-bit data transfer, only one of the 32-bit data ports 244-251 is used, and the SUBPORT FIFO 383 will contain only one data port address. During a 64-bit data transfer, two of the 32-bit data ports 244-251 are used, and the SUBPORT FIFO 383 will contain two different data port addresses. During a 128-bit data transfer, four of the 32-bit data ports are used, and the SUBPORT FIFO 383 will contain four different data port addresses.

The arbiter 338 also includes a set of enable outputs 391-398 that are each coupled to a respective one of the data ports 344-251, and that each carry a respective one of the enable signals DF_EN_0R, DF_EN_0W, DF_EN_1R, DF_EN_1W, DF_EN_2, DF_EN_3, DF_EN_4, and DF_EN_5.

In operation, the arbiter 338 receives a command request signal CMD_REQ from the controller core 319. The command request signal CMD_REQ prompts the arbiter 338 to read a command CMD from the command storage portion 306. In more detail, the arbiter 338 selects a command port from the command storage portion 306 via the selector 318. The selection is based on the command priorities that are stored in the memory cells 239, and the signals EMPTY FLAG 0-5 that are received at the inputs 343-346. In particular, the arbiter 338 goes through the EMPTY FLAG signals from the command ports in a predetermined sequence that is defined by the command port priorities, and selects the first command port that is not empty. The arbiter then uses the CMD_PORT_SEL lines to control the selector 318 so that a command from output of the selected command port is routed through the selector to the selector output.

When a command is read from the command storage portion 306 through the selector 318, the command CMD arrives at the command input 361 of the arbiter 338. The arbiter 338 extracts certain information from the command CMD, and stores that information in the FIFOs 362. For example, from the command CMD, the arbiter 338 extracts a portion of the memory address, a user burst length that is the amount of data requested to be transferred, and the address of the data port through which the data is to be transferred. In addition, the arbiter 338 generates masking information (discussed in greater detail later) that is stored in the FIFOs 362, and that indicates whether it is necessary to ignore portions of memory blocks that are accessed in carrying out a data transfer. Also, the arbiter 338 sends the controller core 319 the signal CDM IN, in order to indicate to the controller core 319 that a command is being read in. Moreover, the arbiter 338 generates for that command the value CMD_CNT, and sends this value to the controller core 319. In addition, when a command is being read in, the arbiter 338 actuates a respective one of the signals CMD STATUS FLAG 0-5 to advise the selected command port that a command is being read from that command port. After one or more commands have been read by the arbiter 338, the arbiter waits for one of the signals MEMORY READ EN and MEMORY WRITE EN to go high. If the signal MEMORY READ EN goes high, the arbiter 338 facilitates a read transfer, as discussed in more detail later. If the signal MEMORY WRITE EN goes high, the arbiter 338 facilitates a write transfer, as discussed in more detail later.

A high-level description of the operation of the entire memory controller 240 will now be provided. The memory controller 240 facilitates transfers of data between the FPGA fabric 238 and the DRAM 232. Recall that, for purposes of this discussion, it is being assumed that the DRAM 232 has a burst length of 8 words, and a word width of 8 bits. Also recall that, for purposes of this discussion, it is being assumed that the data ports were configured during field programming so that data ports 244 and 246 are concatenated for 64-bit read transfers, data ports 245 and 247 are concatenated for 64-bit write transfers, data ports 248 and 250 are each separately configured for 32-bit read transfers, and data ports 249 and 251 are each separately configured for 32-bit write transfers. Before providing a write command to the command storage portion 306, the FPGA fabric 238 loads the data to be transferred into the appropriate data ports. For example, the FPGA fabric looks at the STATUS FLAG signal from the particular data port that is to be used to temporarily store data for the transfer. When the STATUS FLAG is asserted, the corresponding data port is full, and so the fabric 238 has to wait before providing data to that data port. When that STATUS FLAG is deasserted, the corresponding data port is available to accept data to be transferred. The FPGA fabric 238 can then supply all of the data to be transferred to the appropriate data port before providing an associated write command to the command storage portion 238.

Consider how the FPGA fabric 238 supplies the command storage portion 306 with commands. The FPGA fabric 238 checks to see if a command port FIFO is full before loading a command into that command port. When any one of the command ports 309-314 is full, its FULL FLAG is asserted, and so the FPGA fabric 238 knows that the command port is full. The FPGA fabric 238 selectively loads commands into one or more of the command ports 309-314 that are not full, as necessary for desired memory reads or writes. In due course, the controller core 319 requests that a command be read in from the command storage portion 306, by supplying the signal CMD REQ to the arbiter 338. The arbiter 338 then selects a command port based on factors that include the EMPTY FLAG signals 350-353 and the command priorities in the memory cells 239. For example, as explained earlier, the arbiter 338 selects a command port by going through the EMPTY FLAGS of the command ports in a predetermined sequence defined by the command port priorities stored in the memory cells 239, and by selecting the first command port that is not empty. The arbiter 338 accesses the selected command port by sending the select signal CMD_PORT_SEL to the select input of the command selector 318. The selector 318 then supplies a command from the selected command port to the selector output.

The command that is supplied to the output of the command selector 318 makes its way to the command inputs 324 and 361 of the controller core 319 and the arbiter 338, respectively. The controller core 319 receives the command at its input 324 and extracts information from that command. Meanwhile, the arbiter 338 receives the same command at its input 361, and also extracts selected information from the command.

The arbiter uses the DRAM_BL, DRAM_PIN_COUNT, and the DATA PORT CONFIGURATION from the memory cells 239, along with some information extracted from the command, to determine masking information and a value CMD_CNT corresponding to that command. After determining the command count value CMD_CNT, the arbiter 338 supplies the command count value CMD_CNT to the input 325 of the controller core 319. The arbiter 338 then supplies the signal CMD IN to the controller core 319 to indicate that a command is currently being read from the command storage portion 306, and is arriving at the input 324 of the controller core. The controller core 319 stores the CMD_CNT value in the FIFO 328, along with information extracted from the command, such as a starting memory address, and whether the memory access will be a READ or a WRITE. Meanwhile, the arbiter 338 stores the mask information it has generated in the FIFOs 326, along with information extracted from the command, such as the user burst length, and the address of the data port that will be used for the transfer. The arbiter 338 sends one of the signals CMD STATUS FLAGs 0-5 to the command port from which the command is being read, so that the command port knows a command is being read from it. This process of filling up the FIFOs 328 and 362 in the controller core 319 and arbiter 338 continues indefinitely, with pauses whenever the FIFOs 328 and 362 are temporarily filled with information for four commands.

Meanwhile, in parallel with this process of loading commands into the FIFOs 328 and 362, the controller core 319 and the arbiter 338 are executing commands as the commands reach the end of the FIFOs 328 and 362. When a command is executed by the controller core 319 and the arbiter 338, the information previously stored for that command in the FIFOs 328 and 362 is used to execute the command.

The controller core 319 initiates execution of a command by sending a starting memory address to the ADDR input 235 of the DRAM 232, and by sending control signals to the MEM CTRL inputs 233 of the DRAM 232. Moreover, the controller core 319 supplies a read or write enable signal MEMORY READ EN or MEMORY WRITE EN to one of the respective inputs 381 and 382 of the arbiter. In response to receipt of either of these signals, the arbiter 338 reads from its FIFOs 362 the information for that command, and then loads the SUBPORT FIFO 383 with one or more data port addresses that are to be used for the data transfer. Based on the command and mask information stored in the FIFOs 362, the arbiter 338 selectively asserts the DF_EN signals to the data ports, in a manner so that the data ports being used for that data transfer are enabled at appropriate times.

For a READ data transfer, the DRAM 232 transfers data in successive words of 8 bits each over the data bus 236 and into the data converter 241. Each pair of successive 8-bit words supplied to the data converter 241 are combined into a single 16-bit word that is subsequently transferred over the data bus 242 to the data storage portion 243. As the enable signals DF_EN enable the appropriate data port or ports, the data is stored in the data storage portion 243. Eventually, 32 bits of data is stored in each data port being used for the READ transfer. In due course, the FPGA fabric 238 reads the 32 bits of data that are stored in each data port being used for the READ transfer.

For a WRITE data transfer, the arbiter 338 asserts one or more of the enable signals DF_EN enable, so that the 32 bits of data in each data port being used for the WRITE transfer are transferred in successive groups of sixteen bits over the data bus 242 and into the data converter 241. Each 16-bit word supplied to the data converter 241 is divided into a pair of 8-bit data memory words that are successively transferred over the data bus 236 to the DRAM 232. In some situations, the start memory address and/or end memory address of the data being transferred falls on an address that is not a memory address boundary. In those situations, as to memory locations in the memory access that are before and/or after the locations being written, no data port is enabled, and so the signal MASK goes high to tell the DRAM 232 that it should not change data that is already in those memory locations.

Figure 4:
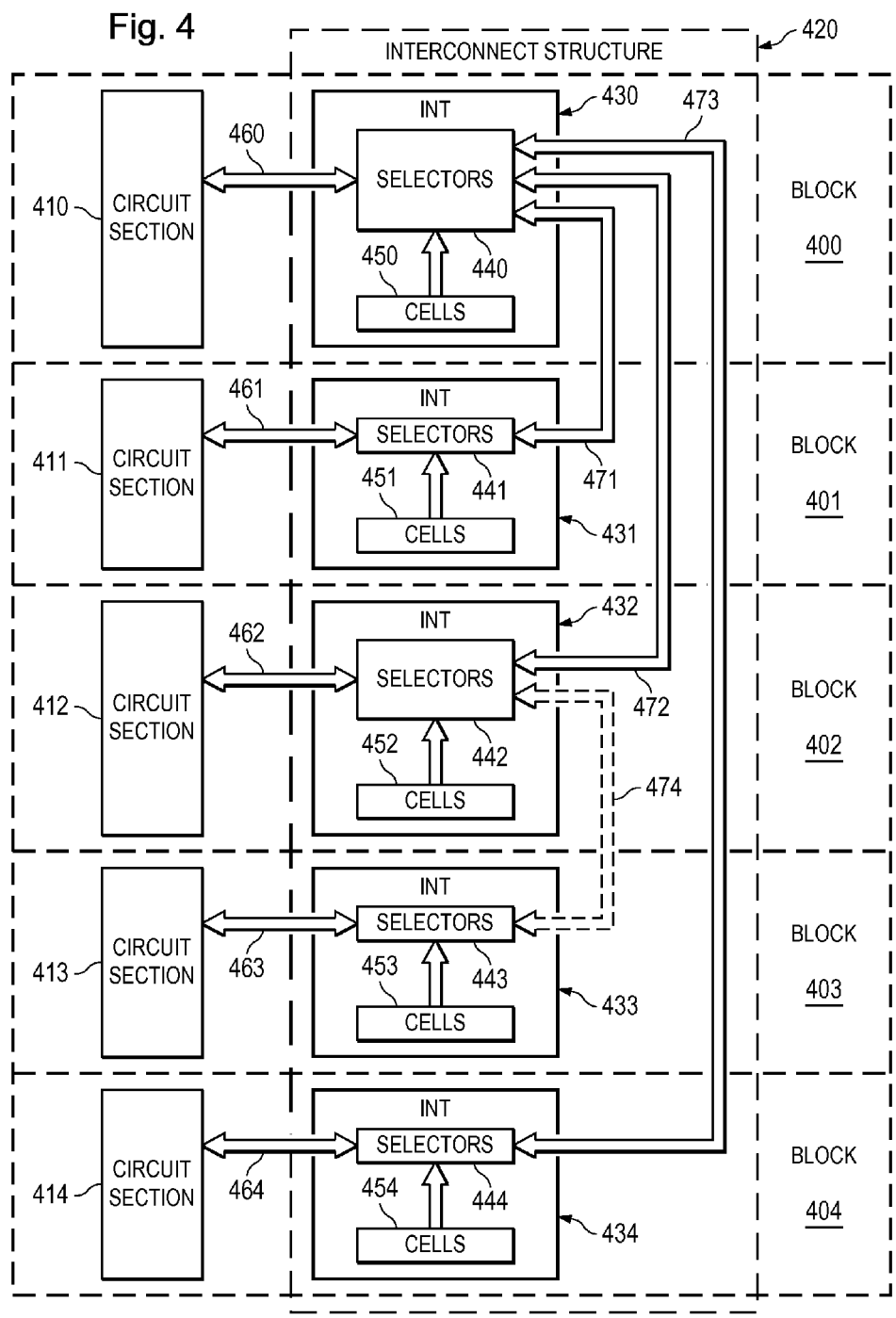
FIG. 4 is a diagram showing several physically contiguous sections or blocks of an integrated circuit that includes the FPGA of FIG. 3, and showing some circuitry of the FPGA that is present within each of these blocks.

FIG. 4 is a diagrammatic view of a portion of FPGA 100 (FIG. 3) that includes a plurality of physically contiguous sections or blocks 400-404. Some circuitry of the FPGA 100 (FIG. 3) is implemented within each of these blocks 400-404. In particular, the blocks 400-404 respectively contain circuit sections 410-414 that are portions of the circuitry within the FPGA 100.

An interconnect structure briefly mentioned above is represented diagrammatically in FIG. 4 with broken lines 420. The interconnect structure 420 routes incoming signals from an external device (such as the DRAM 232 of FIG. 3) to various sections of the FPGA 100, routes outgoing signals from the FPGA to the external device, and routes internal signals traveling within the FPGA. The interconnect structure 420 contains the interconnection sections 316A-316L (FIG. 3), as well as a large number of other interconnection sections that are functionally equivalent to the interconnection sections 316A-316L. For purposes of simplicity, five of those other interconnection sections are shown at 430-434 in FIG. 4, and they are respectively implemented within the blocks 400-404. The interconnection sections 430-434 include respective selector sections 440-444, as well as respective programmable memory cell sections 450-454. The selector sections 440-444 each include routing circuitry such as switches or multiplexors that route electrical signals traveling through the respective interconnection sections 430-434. The memory cell sections 450-454 are respectively coupled to the selector sections 440-444, and instruct the selector sections to implement desired routing configurations specified during user field programming. The circuit sections 410-414 are respectively coupled to the selector sections 430-434 through hard wiring at 460-464.

Each interconnection section is directly electrically coupled to some but not all of the other interconnection sections. In FIG. 4, for example, the interconnection section 430 is not directly electrically coupled to the interconnection section 433, but is directly electrically coupled to the three interconnection sections 431, 432, and 434, through respective metallization runs 471, 472, and 473. More specifically, the selector section 440 is coupled to the selector sections 441, 442, and 444 through the respective metallization runs 471, 472, and 473. However, there are no direct metallization runs between the selector sections 440 and 443, and thus no direct electrical coupling exists between the interconnection sections 430 and 433. The selector section 443 is directly coupled to the selector section 442 through metallization runs 474 (shown in broken lines to avoid confusion with the metallization runs 471-473 that are directly coupled to the selector section 440). The metallization runs 471-474 each include vias, contacts, and metal interconnect lines in various layers of the integrated circuit that includes the FPGA 100.

The circuit section 410 is capable of communicating directly with any of the circuit sections 411, 412, or 414 without going through an intermediate interconnection section. To illustrate, if the memory cell sections 450-452 and 454 are appropriately programmed during field programming, then a signal sent by the circuit section 410 can be routed to the circuit section 411 through the selector section 440, the metallization runs 471, and the selector section 441. Similarly, the same signal from the circuit section 410 can be routed to the circuit section 412 through the selector section 440, the metallization runs 472, and the selector section 442. The same signal from the circuit section 410 can also be routed to the circuit section 414 through the selector section 440, the metallization runs 473, and the selector section 444. However, for that same signal to be routed to the circuit section 413, the signal has to be routed through an intermediate interconnection section. For example, the signal sent from the circuit section 410 may first be routed through the selector section 440 and the metallization runs 472 to the selector section 442 of the interconnection section 432, which serves as the intermediate interconnection section. The selector section 442 can then route that signal through the metallization runs 474 and the selector section 443 to the circuit section 413. It is not necessary for the selector section 442 to route that signal to the circuit section 412, although it may do so.

Figure 5:
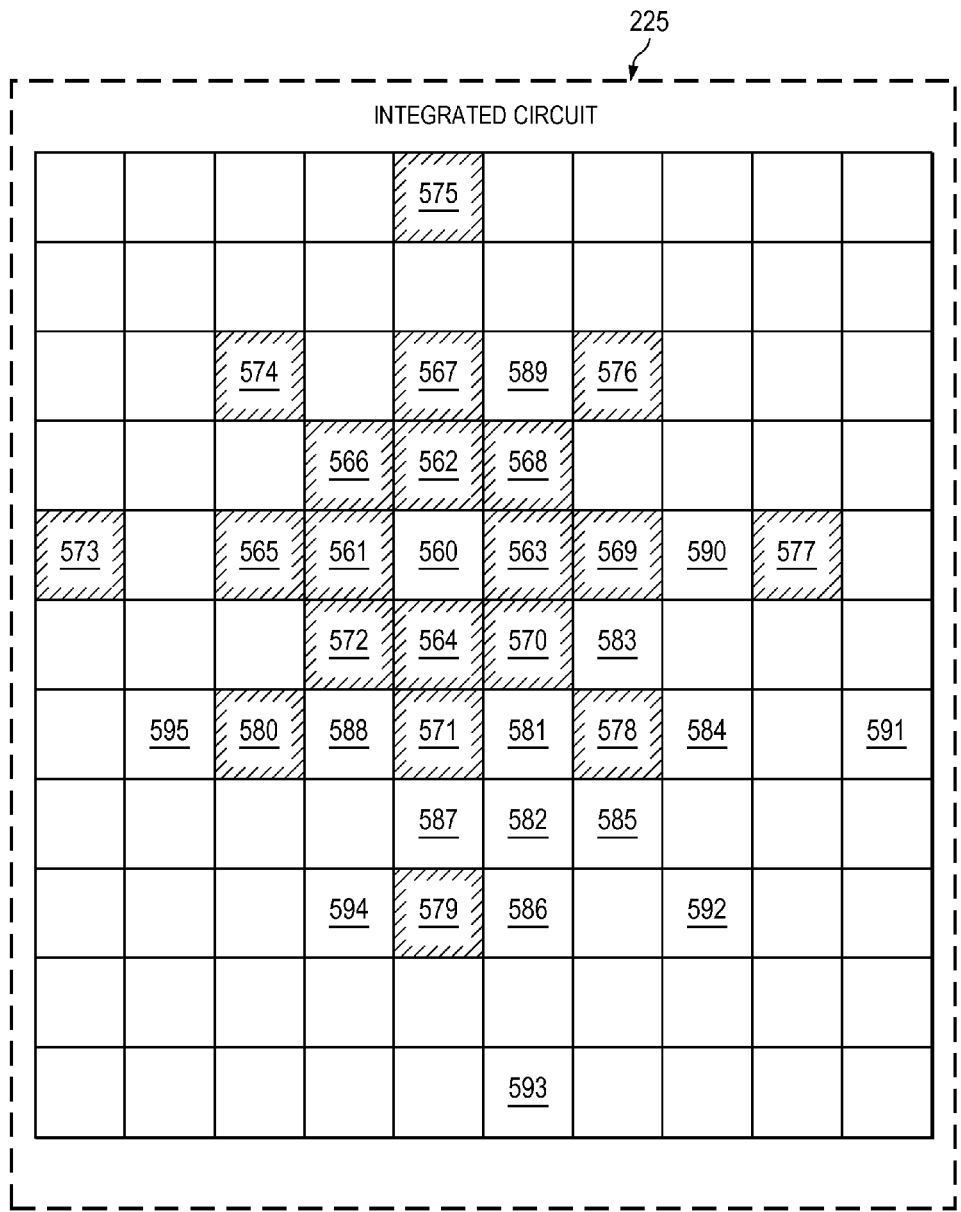
FIG. 5 is a diagrammatic top view of an array of physically contiguous sections or blocks of the integrated circuit of FIG. 3.

FIG. 5 is a diagrammatic top view of an array of physically contiguous sections or blocks of the FPGA 100 (FIG. 3). Each of these blocks in FIG. 5 is similar to one of the blocks 400-404 in FIG. 4. FIG. 5 is used to explain the configuration of electrical coupling between these blocks. The blocks are diagrammatically illustrated in FIG. 5 as rows and columns of adjacent rectangular blocks, where each of the blocks contains a not-illustrated interconnection section similar to the interconnection sections 430-434 (FIG. 4), and contains a not-illustrated circuit section similar to the circuit sections 410-414 (FIG. 4).

Distances between blocks in FIG. 5 can be measured in "Manhattan distance", which is the distance between two points measured along orthogonal axes. As applied to the case at hand, the Manhattan distance between two blocks is measured in terms of the number blocks in orthogonal directions along columns and rows. As one example, the Manhattan distance between the blocks 578 and 560 is a sum of the distance between the blocks 560 and 571 and the distance between blocks 571 and 578. The Manhattan distance between the blocks 571 and 560 is two blocks, because a signal from block 560 has to travel a distance of two blocks to get to the block 571. Similarly, the Manhattan distance between the blocks 571 and 578 is also two blocks. Therefore, the Manhattan distance between the blocks 560 and 578 is four blocks (two blocks+two blocks).

Each of the blocks in FIG. 5 is directly electrically coupled to all blocks that are one or two blocks away in Manhattan distance, and is also directly coupled to some but not all blocks that are four blocks away in Manhattan distance. As one example, from the perspective of block 560, blocks 561-564 are each one block away, and blocks 565-572 are each two blocks away. Thus, direct electrical coupling exists between the block 560 and all of the blocks 561-564 and 565-572. Direct electrical coupling also exists between block 560 and certain blocks that are four blocks away in Manhattan distance. In particular, blocks 573-580 are each four blocks away and are each directly electrically coupled to the block 560. Thus, the interconnection sections in the blocks 561-580 are each directly electrically coupled through respective metallization runs to the interconnection section in the block 560. For ease of illustration, all of the blocks 561-580 that are directly electrically coupled to block 560 are designated in FIG. 5 by stippling.

Although not specifically illustrated, the coupling pattern discussed above for block 560 also exists for each of the other blocks of the FPGA 100. As an example, from the perspective of block 581, blocks 571, 570, 578, and 582 are one block away, blocks 564, 563, and 583-588 are two blocks away, and blocks 561 and 589-595 are four blocks away. Thus, direct electrical coupling exists between the interconnection section in block 581 and the interconnection sections in each of blocks 571, 570, 578, 582, 564, 563, 583-588, 561 and 589-595.

However, no direct electrical coupling exists between the blocks 581 and 560. Thus, for a signal to be routed from the circuit section in block 560 to the circuit section in block 581, the signal would need to be routed through an intermediate interconnection section, such as the interconnection section in one of the blocks 561, 563, 564, 570, 571, or 578, each of which is directly electrically coupled to both of blocks 560 and 581. The specific path of each signal through the interconnect structure 420 (FIG. 4) is set during user field programming of the memory cell sections that control the selector sections in each of the interconnection sections, and does not subsequently change during system operation. Therefore, the interconnect structure 420 allows a signal from a given interconnection section to be routed to any other interconnection section of the interconnect structure.

Figure 6:
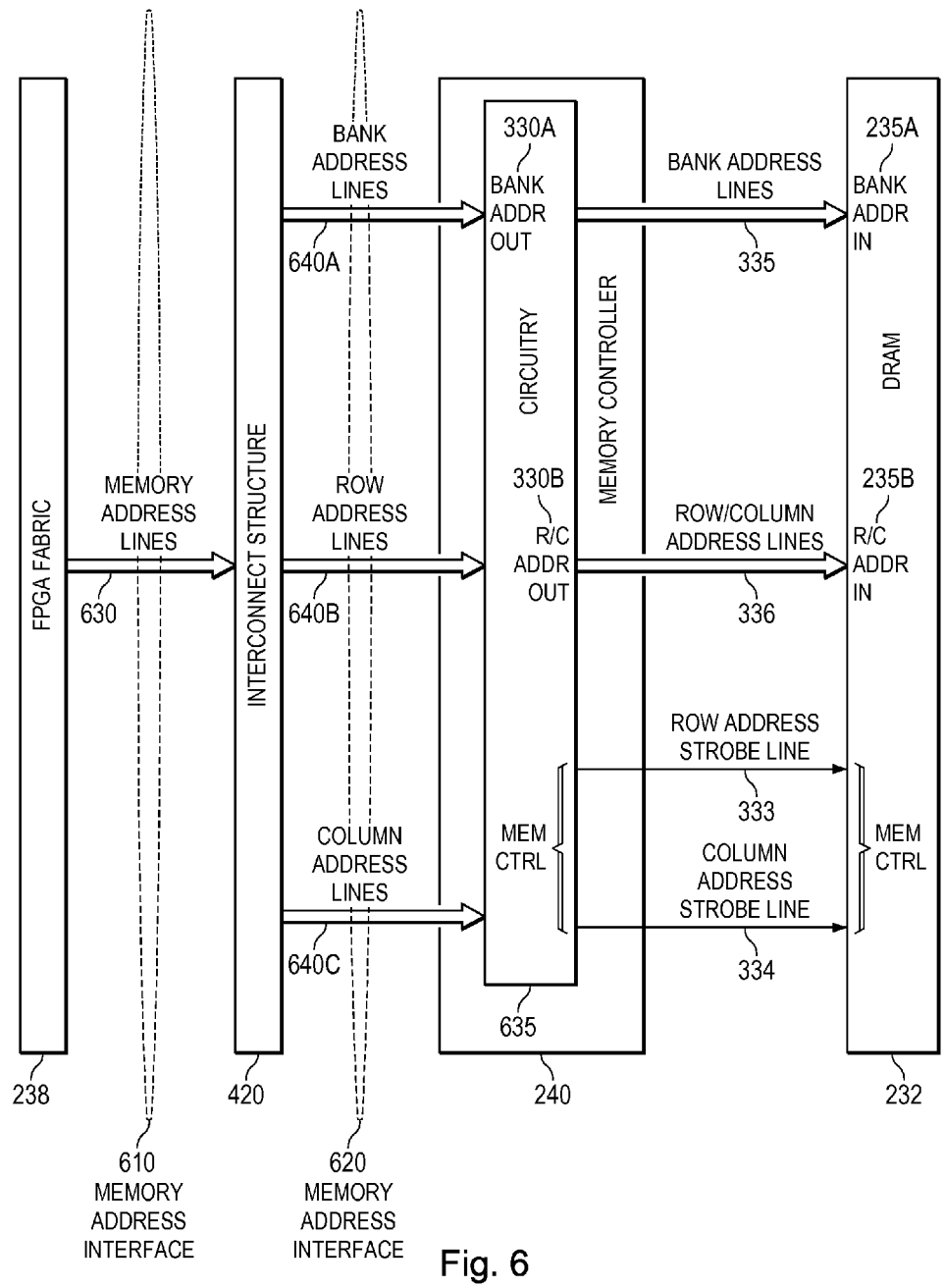
FIG. 6 is a block diagram showing in more detail the DRAM, the FPGA fabric, and the memory controller circuit of FIG. 3, including a memory address interface between the FPGA fabric and the interconnect structure, and a further memory address interface between the interconnect structure and the memory controller circuit.

FIG. 6 is a diagrammatic view showing the DRAM 232 (FIG. 3), and showing a portion of the FPGA 100 (FIG. 1) in greater detail. In particular, FIG. 6 diagrammatically illustrates the FPGA fabric 238 (FIG. 3), the interconnect structure 420 (FIG. 4), the memory controller 240 (FIG. 3), the DRAM 232 (FIG. 3), an interface 610 between the FPGA fabric and the interconnect structure, and an interface 620 between the interconnect structure and the memory controller. The interconnect structure 420 includes the interconnection sections 316A and 316G (FIG. 3). As discussed above in association with the command data lines CMD O-CMD 5 (FIG. 3), respective interfaces exist between the FPGA fabric 100 and each of the interconnection sections 316A-316F (FIG. 3), and respective interfaces exist between each of the interconnection sections 316G-316L (FIG. 3) and the command ports 309-314 (FIG. 3). These interfaces each include a memory address interface for the transfer of memory addresses, a data interface for the transfer of data signals (such as command parameters), and a control interface for the transfer of control signals. In FIG. 6, the interface 610 is the memory address interface between the interconnection section 316A and the FPGA fabric 238, and the interface 620 is the memory address interface between the interconnection section 316G and the command port 309. Thus, the interfaces 610 and 620 are both associated with the command data line CMD 0. The command data lines CMD 1 to CMD 5 are each similar to the command data lines CMD 0, and each include memory address interfaces similar to the interfaces 610 and 620. For clarity and simplicity, the following discussion will focus only on the command data lines CMD 0, but it will be understood that this discussion of command data lines CMD 0 is equally applicable to each of command data lines CMD 1 to CMD 5.

Focusing now in more detail on the command data lines CMD 0, memory address lines 630 extend through the memory address interface 610, and couple the FPGA fabric 238 and the interconnect structure 420. In addition, memory address lines 640 extend through the memory address interface 620, and couple the interconnect structure 420 and circuitry 635 within the memory controller 240. The circuitry 635 includes the command storage portion 306, the controller core 319, and the arbiter 338 (FIG. 3). The memory address lines 640 are conceptually divided into three groups, which are bank address lines 640A, row address lines 640B, and column address lines 640C. In the disclosed embodiment, the bank address lines 640A, the row address lines 640B, and the column address lines 640C respectively include 3, 15, and 12 address lines, but they could alternatively include different numbers of address lines, or be arranged with a different grouping. Since the circuitry 635 includes the arbiter 338 (FIG. 3), the circuitry 635 has the arbiter's bank address output BANK ADDR OUT 330A and row/column address output R/C ADDR OUT 330B.

As discussed above in association with FIG. 3, the DRAM 232 has the bank address input BANK ADDR IN 235A and the row/column address input R/C ADDR IN 235B (FIG. 3). The bank address output BANK ADDR OUT 330A is coupled through the bank address lines 335 to the bank address input BANK ADDR IN 235A, and the row/column address output R/C ADDR OUT 330B is coupled through the row/column address lines 336 to the row/column address input R/C ADDR IN 235B. The row address strobe line 333 and the column address strobe line 334 (FIG. 3) each couple outputs of the circuitry 635 to inputs of the DRAM 232.

The FPGA fabric 238 outputs memory address signals onto the memory address lines 630 in a byte address format that includes a plurality of bits. The total number of bits in an actual address will depend on the specific type and overall size of the DRAM 232. As discussed above, the interconnect structure 420 performs address translation on the memory address signals carried by the memory address lines 630. Specifically, the interconnect structure 420 translates the memory address signals from the byte address format received over lines 630 into a physical address format that is supplied to the memory address lines 640.

The memory address translation performed by the interconnect structure 420 is carried out in a manner so that each of the lines in a subset of the memory address lines 630 is coupled to a respective line in a subset of the memory address lines 640. The subset of the memory address lines 630 may include all or only some of the memory address lines 630, and the subset of the memory address lines 640 may include all or only some of the memory address lines 640. By coupling memory address lines from one subset to appropriate memory address lines in the other subset, the memory address signals carried by the subset of the memory address lines 630 are mapped to respective lines in the subset of the memory address lines 640. As part of the memory address translation, each memory address is divided into a bank address portion that is carried by the bank address lines 640A, a row address portion that is carried by the row address lines 640B, and a column address portion that is carried by the column address lines 640C. Consequently, the subset of the memory address lines 640 can be viewed as consisting of a combination of three smaller subsets, which are a subset of the bank address lines 640A, a subset of the row address lines 640B, and a subset of the column address lines 640C.

The circuitry 635 receives a memory address in physical address format from the interconnect structure 420 through the memory address lines 640, and in due course outputs the bank address portion through the bank address lines 335 to the bank address input BANK ADDR IN 235A of the DRAM 232. The circuitry 635 also successively outputs the row and column address through the row/column address lines 336 to the row/column address input R/C ADDR IN 235B of the DRAM 232. When the row address is being outputted, the column address is not being outputted. When the row address on lines 336 is settled, the circuitry 635 provides a pulse on the row address strobe signal to the DRAM 232 through the row address strobe line 333, which indicates that the row address is ready to be accepted. A similar operation occurs with respect to the column address and the column address strobe line 334. The specific configurations of the memory address lines 630 and 640 discussed above are merely exemplary, and other embodiments may have different configurations.

Figure 7:
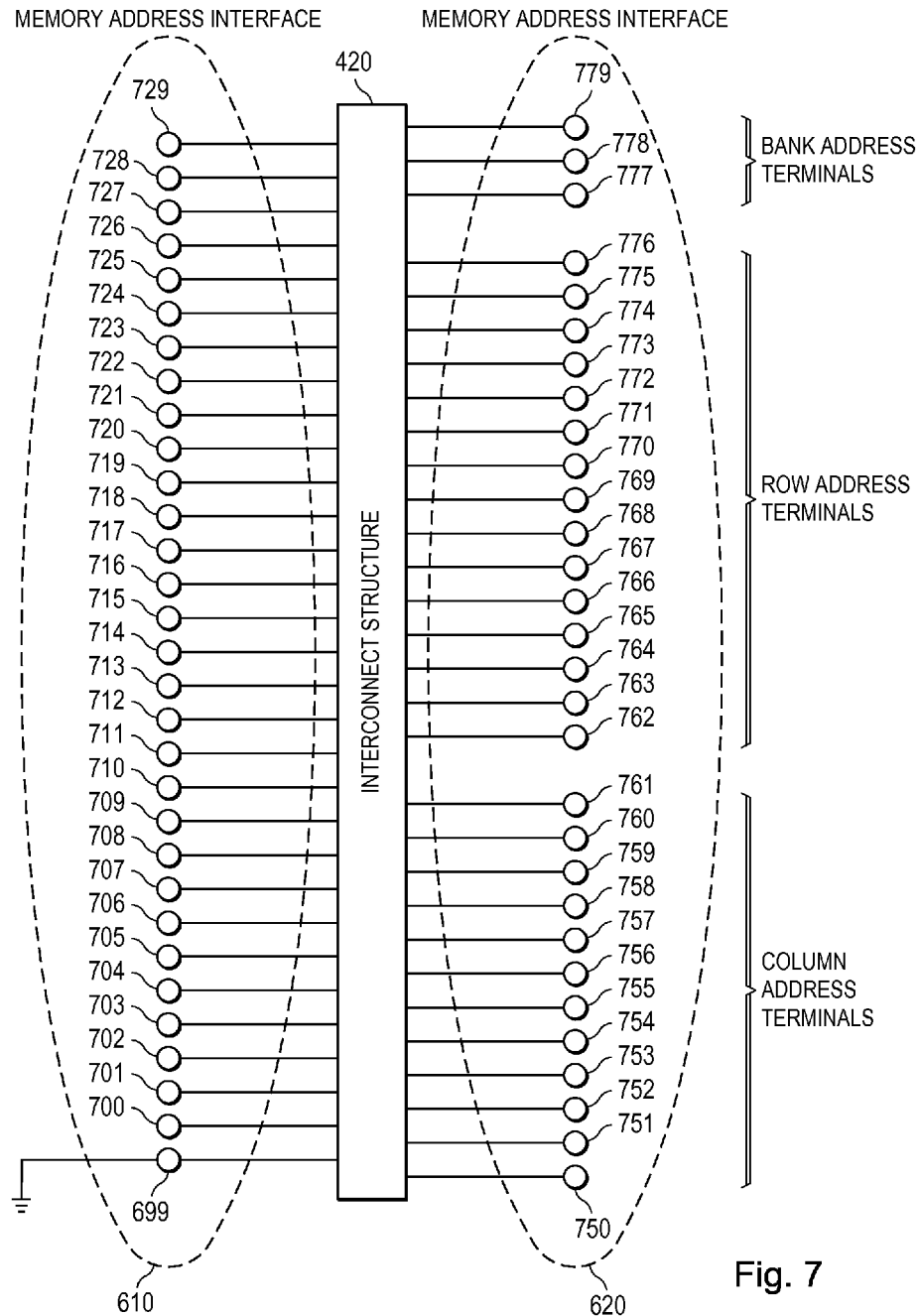
FIG. 7 is a block diagram showing in greater detail the interconnect structure of FIG. 4 and the two memory address interfaces of FIG. 6.

FIG. 7 is a diagrammatic view of the interconnect structure 420 (FIGS. 4 and 6), and the interfaces 610 and 620 (FIG. 6). The interface 610 has a plurality of byte memory address terminals (byte address terminals) 699-729 that are each part of a respective one of the memory address lines 630 (FIG. 6). The byte address terminals 700-729 are each coupled between the FPGA fabric 238 (FIGS. 3 and 6), and a respective one of the numerous selector sections in the interconnect structure 420. The byte address terminal 699 is coupled to ground, and to one of the selector sections in the interconnect structure 420.

The interface 620 has a plurality of physical memory address terminals (physical address terminals) 750-779 that are each a part of a respective one of the memory address lines 640 (FIG. 6). The physical address terminals 750-799 are each coupled between a respective one of the numerous selector sections in the interconnect structure 420, and the circuitry 635 (FIG. 6). The physical address terminals 750-779 are divided into three groups, which are column address terminals 750-61, row address terminals 762-776, and bank address terminals 777-779. As discussed above, the subset of memory address lines 640 (FIG. 6) used for a given mapping includes a subset of the column address lines 640C, a subset of the row address lines 640B, and a subset of the bank address lines 640A. Therefore, the physical address terminals 750-799 used for a given mapping also include three subsets, which are a subset of the column address terminals 750-761, a subset of the row address terminals 762-776, and a subset of the bank address terminals 777-779. The subset of the column address terminals 750-761 may include all or only some of the column address terminals, the subset of the row address terminals 762-776 may include all or only some of the row address terminals, and the subset of the bank address terminals 777-779 may include all or only some of the bank address terminals.

The memory address output by the FPGA fabric 238 (FIGS. 3 and 6) is supplied to the byte address terminals 699-729, so that each of the address terminals in the subset carries a respective bit of the memory address. The interconnect structure 420 performs address translation on the memory address, as discussed in general terms above in association with FIG. 6. As part of the memory address translation, the interconnect structure 420 will (1) map a group of the incoming memory address bits on some of the terminals 699-729 to a subset of the column address terminals 750-761 as the column address, (2) map another group of the incoming memory address bits on others of the terminals 699-729 to a subset of the row address terminals 762-776 as the row address, and (3) map yet another group of the incoming memory bits on still others of the address terminals 699-729 to a subset of the bank address terminals 777-779 as the bank address. The memory address translation is implemented in the interconnect structure 420 by configuring selector sections therein during field programming so that they appropriately route incoming memory address bits from the byte address terminals 699-729 to appropriate physical address terminals 750-779 in accordance with a mapping configuration corresponding to characteristics of the particular memory device used for the DRAM 232.

Figure 8D:
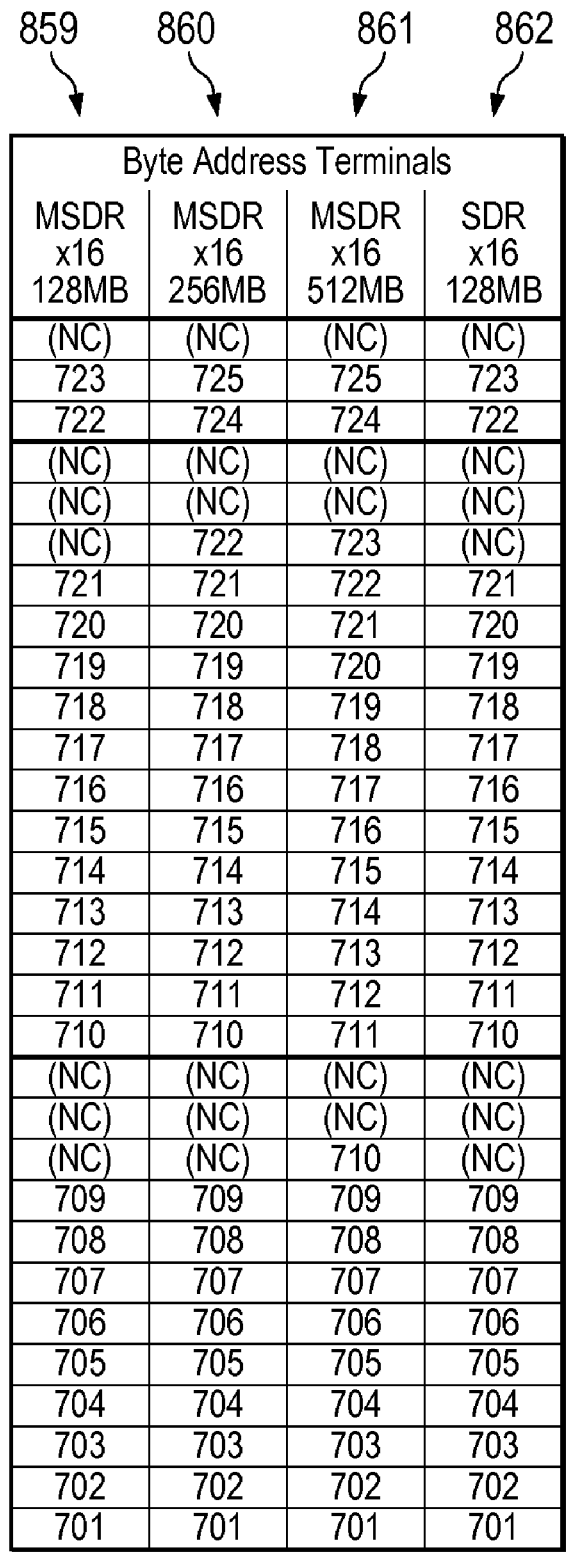
FIG. 8 (which includes FIGS. 8A-8D) is a table showing a plurality of different mapping configurations that can be implemented between the two memory address interfaces of FIG. 6, the mapping being carried out within the interconnect structure.

FIG. 8 (which includes FIGS. 8A-8F) shows a table 800 that contains columns 810 and 820-862 each setting forth a list of address terminals. The table 800 illustrates the various memory address mapping configurations that, in the disclosed embodiment, can be implemented between the physical address terminals 750-779 and the byte address terminals 699-729 for various different types of DRAMs. More specifically, column 810 contains a list of the physical address terminals 750-779. Columns 820-862 each correspond to a respective different type of external memory device (including the DRAM 232 and a plurality of other similar DRAM memory devices). Columns 820-862 each contain a list of a subset of the byte address terminals 699-729. For each mapping function, one of the columns 820-862 is selected, and then each of the byte address terminals in column 810 is coupled to the corresponding address terminal identified in the same row of the selected column. For example, column 820 corresponds to an external memory device that is of the double data rate (DDR) type, that has a memory word width of 16 bits, and that has a memory density (total size) of 128 MB. For this particular type of DRAM, each address terminal in column 810 would be coupled to the address that is in the same row of column 820. More specifically, the byte address terminals 722 and 723 would be respectively coupled to the physical address terminals 777 and 778, the byte address terminals 710-721 would be respectively coupled to the physical address terminals 762-773, and the byte address terminals 701-709 would be respectively coupled to the physical address terminals 750-758. Some rows in column 820 contain "(NC)" to indicate that the corresponding byte address terminals in column 810 are not coupled to any of the physical address terminals 750-779. As another example, column 830 corresponds to a different external memory device that is of the double data rate (DDR) type, that has a memory word width of 4 bits, and that has a memory density (total size) of 512 MB. For this particular type of DRAM, each address terminal in column 810 would be coupled to the address terminal that is in the same row of column 830.

Although a selected embodiment has been illustrated and described in detail, it should be understood that substitutions and alterations are possible without departing from the spirit and scope of the present invention, as defined by the claims that follow.

What is claimed is:

1. An apparatus comprising a device having programmable circuitry that includes:
   a first interface having a plurality of first address terminals;
   a second interface having a plurality of second address terminals; and
   an interconnect structure coupled between the first and second interfaces, the interconnect structure is configured during field programming to electrically couple each of the address terminals in a first subset of the first address terminals to respective address terminals in a second subset of the second address terminals according to a selected one of a plurality of different mapping functions,
   wherein the interconnect structure is configured to convert an address specified in a byte address format received via the first interface to an address specified in a physical address format that is output via the second interface.

2. An apparatus according to claim 1, wherein the second address terminals are divided into a plurality of mutually exclusive groups.

3. An apparatus according to claim 2,
   wherein the groups of second address terminals include a first group and a second group; and
   including further circuitry that has first and second sets of address inputs that are functionally different, the first set of address inputs being coupled to the first group of second address terminals, and the second set of address inputs being coupled to the second group of second address terminals.

4. An apparatus according to claim 3,
   wherein the groups of second address terminals include a third group;
   wherein the further circuitry has a third set of address inputs that is functionally different from the first and second sets, the third set of address inputs being coupled to the third group of second address terminals;
   wherein the first, second, and third groups of second address terminals respectively serve as bank, row, and column address terminals; and
   wherein the first, second, and third sets of address inputs are bank, row, and column address inputs.

5. An apparatus according to claim 3,
   wherein the further circuitry has functionally different first and second sets of address outputs;
   wherein the first and second address inputs respectively receive first and second portions of a memory address; and
   wherein the further circuitry provides the first and second portions of the memory address respectively to the first and second sets of address outputs.

6. An apparatus according to claim 5, including a memory device having third and fourth sets of address inputs that are functionally different and that are respectively coupled to the first and second sets of address outputs.

7. An apparatus according to claim 1, wherein the interconnect structure includes a plurality of field programmable selectors that selectively route electrical signals, each of the first address terminals and each of the second address terminals being coupled to a respective one of the selectors.

8. An apparatus according to claim 1, wherein the programmable circuitry includes:
   a circuit portion having address outputs that are coupled to the first address terminals; and a memory control portion having address inputs that are coupled to the second address terminals.

9. An apparatus according to claim 8, wherein the circuit portion supplies a memory address to the first address terminals.

10. An apparatus according to claim 8, wherein the memory control portion receives a memory address from the second address terminals.

11. An apparatus according to claim 1,
wherein the first interface has a plurality of first data terminals and a plurality of first control terminals, and
wherein the second interface has a plurality of second data terminals and a plurality of second control terminals.

12. An apparatus according to claim 1,
wherein the first subset includes all of the first address terminals, and
wherein the second subset includes all of the second address terminals.

13. A method involving a device having programmable circuitry that includes a first interface having a plurality of first address terminals, a second interface having a plurality of second address terminals, and an configurable interconnect structure coupled between the first and second interfaces, the method comprising configuring the interconnect structure during field programming of the device in a manner so that each of the address terminals in a first subset of the first address terminals is coupled to respective address terminals in a second subset of the second address terminals according to a selected one of a plurality of different mapping functions,
wherein the second address terminals are divided into a plurality of mutually exclusive groups,
wherein the configuring is carried out so that each of the mutually exclusive groups has one of the second address terminals therein coupled to one of the first address terminals in the first subset,
wherein the mutually exclusive groups of second terminals include a first group and a second group,
wherein the device includes further circuitry that has first and second sets of address inputs that are functionally different,
wherein the configuring is carried out so that the second address terminals in the first group are coupled to the first set of address inputs, and the second address terminals in the second group are coupled to the second set of address inputs,
wherein the further circuitry has functionally different first and second sets of address outputs,
wherein the configuring is carried out so that first and second portions of a memory address are supplied to the first and second address inputs, respectively, and
supplying the first and second portions of the memory address from the first and second sets of address inputs to the first and second sets of address outputs, respectively.

14. A method according to claim 13,
wherein the mutually exclusive groups of second terminals further include a third group;
wherein the further circuitry has a third set of address inputs that is functionally different from the first and second sets;
wherein the configuring is carried out so that the second address terminals in the third group are coupled to the third set of address inputs;
wherein the first, second, and third groups of second address terminals respectively serve as bank, row, and column address terminals; and
wherein the first, second, and third sets of address inputs are bank, row, and column address inputs.

15. A method according to claim 13,
including a memory device having third and fourth sets of address inputs that are functionally different; and
further including supplying the first and second portions of the memory address from the first and second sets of address outputs to the third and fourth sets of address inputs, respectively.

16. A method according to claim 13,
wherein the interconnect structure includes a plurality of field programmable selectors that selectively route electrical signals, and
wherein the configuring is carried out so that each of the first address terminals and each of the second address terminals is coupled to a respective one of the selectors.

17. A method according to claim 13, wherein the programmable circuitry includes a circuit portion having address outputs, and a memory control portion having address inputs, and further including:
routing a first memory address from the address outputs of the circuit portion to the first address terminals; and
routing a second memory address from the second address terminals to the address inputs of the memory control portion.

18. An apparatus comprising a device having programmable circuitry that includes:
a first interface having a plurality of first address terminals configured to receive a byte address;
a second interface having a plurality of second address terminals configured to output a physical address;
an interconnect structure coupled between the first and second interfaces, wherein the interconnect structure is configured during field programming to convert the byte address to the physical address; and
a circuit comprising a plurality of sets of address inputs that are functionally different,
wherein the plurality of second address terminals are divided into a plurality of mutually exclusive groups, and
wherein each set of the plurality of sets of address inputs is coupled to a respective one of a plurality of mutually exclusive groups of the second address terminals.

19. An apparatus according to claim 18,
wherein the plurality of mutually exclusive groups of the second address terminals comprise a first group, a second group, and a third group of second address terminals respectively serving as bank, row, and column address terminals, and
wherein the plurality of sets of address inputs comprise a first set, a second set, and a third set of address inputs serving as bank, row, and column address inputs coupled to the first, second, and third groups respectively.

* * * * *